United States Patent
Chan et al.

(10) Patent No.: US 12,520,556 B2
(45) Date of Patent: Jan. 6, 2026

(54) METHOD FOR FORMING A SEMICONDUCTOR DEVICE

(71) Applicant: IMEC VZW, Leuven (BE)

(72) Inventors: Boon Teik Chan, Wilsele (BE); Hans Mertens, Leuven (BE); Eugenio Dentoni Litta, Leuven (BE)

(73) Assignee: Imec vzw, Leuven (BE)

( * ) Notice: Subject to any disclaimer, the term of this patent is extended or adjusted under 35 U.S.C. 154(b) by 440 days.

(21) Appl. No.: 18/063,991

(22) Filed: Dec. 9, 2022

(65) Prior Publication Data
US 2023/0197831 A1    Jun. 22, 2023

(30) Foreign Application Priority Data
Dec. 17, 2021   (EP) ..................................... 21215638

(51) Int. Cl.
*H10D 64/01*        (2025.01)
*H10D 30/43*        (2025.01)
(Continued)

(52) U.S. Cl.
CPC ......... *H10D 64/018* (2025.01); *H10D 64/015* (2025.01); *H10D 64/017* (2025.01);
(Continued)

(58) Field of Classification Search
CPC .... H10D 30/014; H10D 30/024; H10D 30/43; H10D 30/62; H10D 30/6735; H10D 62/113; H10D 64/015; H10D 64/018
See application file for complete search history.

(56) References Cited

U.S. PATENT DOCUMENTS

| | | | |
|---|---|---|---|
| 9,984,936 B1 * | 5/2018 | Xie .................... | H10D 30/6757 |
| 2017/0194430 A1 * | 7/2017 | Wood ................. | H10D 30/6735 |

(Continued)

OTHER PUBLICATIONS

Extended European Search Report dated Jun. 2, 2022 issued in European Patent Application No. 21215638.4.

*Primary Examiner* — Tuan A Hoang
(74) *Attorney, Agent, or Firm* — McDonnell Boehnen Hulbert & Berghoff LLP

(57) ABSTRACT

A method is provided for forming a semiconductor device. The method includes: forming a device layer stack on a substrate, the device layer stack comprising a bottom sacrificial layer and an alternating sequence of upper sacrificial layers and channel layers; forming a sacrificial gate structure; etching through at least the upper sacrificial and channel layers of the device layer stack while using the sacrificial gate structure as an etch mask; forming a sacrificial spacer covering end surfaces of the upper sacrificial and channel layers; while the sacrificial spacer masks the end surfaces of the upper sacrificial and channel layers, further etching the device layer stack to remove the bottom sacrificial layer and thereby form a cavity in the device layer stack; forming a dielectric layer in the cavity, wherein forming the dielectric layer comprises depositing and then etching back a dielectric bottom material to a level below a bottom-most one of the channel layers; removing the sacrificial spacer; forming recesses and forming inner spacers in the recesses; and forming source and drain regions by epitaxially growing semiconductor material on the end surfaces of the channel layers.

17 Claims, 11 Drawing Sheets

(51) Int. Cl.
 *H10D 30/67* (2025.01)
 *H10D 62/10* (2025.01)

(52) U.S. Cl.
 CPC ......... *H10D 30/43* (2025.01); *H10D 30/6735* (2025.01); *H10D 62/121* (2025.01)

(56) References Cited

U.S. PATENT DOCUMENTS

| | | | |
|---|---|---|---|
| 2018/0114833 A1 | 4/2018 | Bao et al. | |
| 2020/0105869 A1* | 4/2020 | Loubet | H10D 62/151 |
| 2020/0227305 A1* | 7/2020 | Cheng | H10D 30/6735 |
| 2020/0287046 A1 | 9/2020 | Frougier et al. | |
| 2021/0210489 A1 | 7/2021 | Zhang et al. | |
| 2021/0210637 A1* | 7/2021 | Zhang | H10D 30/031 |
| 2021/0366906 A1* | 11/2021 | Huang | H01L 23/5286 |

* cited by examiner

METHOD FOR FORMING A SEMICONDUCTOR DEVICE

CROSS-REFERENCE

This application claims priority based on European patent application no. 21215638.4, filed Dec. 17, 2021, which is incorporated by reference in its entirety.

TECHNICAL FIELD

The present disclosure relates to a method for forming a semiconductor device.

BACKGROUND OF THE PRESENT DISCLOSURE

Modern semiconductor integrated circuit technology includes horizontal channel transistors, for example the horizontal or lateral nanowire FET (NWFET) and nanosheet FET (NSHFET). These transistor structures typically include a source, a drain, a channel comprising one or more nanowire or nanosheet-shaped horizontally extending channel layers and a gate stack. In a gate-all-around (GAA) design, the gate stack wraps all-around the channel layers.

Fabrication methods for horizontal NWFET or NSHFET devices may be based on processing of a semiconductor layer stack of alternating sacrificial layers and channel layers, e.g. of a nanowire or nanosheet shape. The processing may comprise forming of a sacrificial gate across the layer stack, source/drain epitaxy on the channel layers at opposite sides of the sacrificial gate, and subsequent to sacrificial gate removal, gate stack deposition. The processing may (e.g. after sacrificial gate removal and prior to gate stack deposition) include a step of etching away sacrificial layer material above and below the channel layers to form "released" channel layers, such that the gate stack subsequently may be formed to surround the channel layers. Preceding the channel release, so-called "inner spacers" may be formed on end surfaces of the sacrificial layers by laterally recessing the sacrificial layers from both sides of the sacrificial gate, and filling the recesses with a dielectric material. The inner spacers may thus during the subsequent channel release step mask the source/drain regions from the etching. The inner spacers may further provide physical and electrical separation between the source/drain regions and the gate metal in the final device.

The "forksheet" device is a more recent type of horizontal NSHFET device design, allowing a pFET and an nFET to be provided adjacent to each other in relatively close proximity, each controlled by a fork-shaped gate structure and separated by an insulating wall. The insulating wall may be formed between the p- and n-type device region before gate patterning. The wall may thus separate the p-gate trench from the n-gate trench, allowing a much tighter n-to-p spacing.

Forksheet device fabrication methods may comprise processing a pair of layer stacks of alternating sacrificial layers and channel layers. To facilitate a tight n-to-p spacing, the layer stacks may be separated by a trench filled with insulating material to form the insulating wall. Device fabrication may then proceed by applying the fabrication approach outlined above to each of the stacks.

In horizontal channel transistor devices (e.g. the NWFET, the NSHFET and the forksheet), an electrical insulation, e.g. a "bottom insulation" may be needed to mitigate charge carrier leakage from the device into the underlying semiconductor substrate.

SUMMARY OF THE PRESENT DISCLOSURE

In light of the above, it is an objective to provide a method for forming a semiconductor device, allowing providing an electrical insulation underneath the device. Further and alternative objectives may be understood from the following.

According to one aspect, a method is provided for forming a semiconductor device, the method comprising:
- forming a device layer stack on a substrate, the device layer stack comprising a bottom sacrificial layer and over the bottom sacrificial layer an alternating sequence of upper sacrificial layers and channel layers, wherein the bottom and upper sacrificial layers are formed of a first semiconductor material and the channel layers are formed of a second semiconductor material;
- forming a sacrificial gate structure extending across the device layer stack, the sacrificial gate structure comprising a sacrificial gate body and a gate spacer on opposite sides of the sacrificial gate body;
- etching through at least the upper sacrificial and channel layers of the device layer stack while using the sacrificial gate structure as an etch mask such that portions of the upper sacrificial and channel layers are preserved underneath the sacrificial gate structure, wherein end surfaces of the upper sacrificial and channel layers are exposed on opposite sides of the sacrificial gate structure;
- forming (subsequent to said etching) a sacrificial spacer covering the end surfaces of the upper sacrificial and channel layers;
- while the sacrificial spacer masks the end surfaces of the upper sacrificial and channel layers, further etching the device layer stack to remove the bottom sacrificial layer and thereby form a cavity in the device layer stack;
- forming a dielectric layer in the cavity, wherein forming the dielectric layer comprises depositing and then etching back a dielectric bottom material to a level below a bottom-most one of the channel layers;
- removing the sacrificial spacer to expose the end surfaces of the upper sacrificial and channel layers;
- subsequent to removing the sacrificial spacer, forming recesses in the device layer stack by laterally etching back the end surfaces of the upper sacrificial layers from opposite sides of the sacrificial gate structure;
- forming inner spacers in the recesses; and
- subsequent to forming the dielectric layer and the inner spacers, forming source and drain regions by epitaxially growing semiconductor material on the end surfaces of the channel layers.

According to the method, the bottom sacrificial layer underneath the upper sacrificial and channel layers may be "replaced" by a dielectric layer, i.e. a "bottom dielectric layer".

As the bottom sacrificial layer is formed of a same first semiconductor material as the upper sacrificial layers, the device layer stack may be formed with a comparably simple composition, e.g. two different semiconductor materials. This may facilitate fabrication of the device layer stack and enable forming of channel layers of higher material quality.

Using the same material for the bottom sacrificial layer and the upper sacrificial layers precludes selective removal of the bottom sacrificial layer by etching the bottom sacrificial layer selectively to the upper sacrificial layers using a material selective etch. Instead, a selective removal of the bottom sacrificial layer may be facilitated by forming the sacrificial spacer prior to removing the bottom sacrificial layer. The end surfaces of the upper sacrificial layers may thus be masked from the etching process used to remove the bottom sacrificial layer.

Furthermore, as the sacrificial spacer is formed prior to removing the bottom sacrificial layer, and the bottom sacrificial layer is removed prior to forming the recesses and the inner spacers, also the end surfaces of the channel layers may be masked from the etching process used to remove the bottom sacrificial layer. Accordingly, the etching process used to remove the bottom sacrificial layer may be selected more freely with less regard to selectivity towards the upper sacrificial layers and the channel layers.

During the removal of the bottom sacrificial layer, the upper sacrificial and channel layers may be masked by both the sacrificial spacer and the sacrificial gate structure. In other words, the bottom sacrificial layer may be removed by etching the bottom sacrificial layer while using both the sacrificial gate structure and the sacrificial spacer as etch masks.

The removal of the bottom sacrificial layer may comprise etching the bottom sacrificial layer using an isotropic etching process. The bottom sacrificial layer may hence be laterally etched back from the opposite sides of the sacrificial gate structure until removed underneath the upper sacrificial and channel layers.

The sacrificial spacer may be removed subsequent to removing the bottom sacrificial layer, such as prior to depositing the dielectric bottom material.

By etching back (e.g. top-down) the dielectric bottom material to a level below a bottom-most one of the channel layers, each one of the channel layers may be exposed for the subsequent source and drain epitaxy. The level may in particular be such that the end surfaces of a bottom-most one of the upper sacrificial layers are exposed on opposite sides of the sacrificial gate structure. Inner spacers may hence be formed also at the bottom-most upper sacrificial layer.

Forming the recesses may comprise laterally etching back the end surfaces of the upper sacrificial layers using an isotropic etching process selective to the first semiconductor material. The end surfaces of the upper sacrificial layers may thus be recessed in relation to the end surfaces of the channel layers.

By the inner spacers, the (laterally etched back) end surfaces of the upper sacrificial layers may be masked from the source/drain region epitaxy. The inner spacers may further facilitate subsequent process steps for forming a complete device, in accordance with some embodiments described below.

By the term "device layer stack" is hereby meant a structure of layers, sequentially formed on top of each other. The device layer stack may in particular be fin-shaped.

As the device layer stack in some embodiments may comprise an additional channel layer than those mentioned above, the above-mentioned sacrificial layers may also be referred to as "active channel layers" if distinction need be made.

Relative spatial terms such as "top", "bottom", "upper", "lower", "vertical", "over", "above" are herein to be understood as denoting locations or directions within a frame of reference of the substrate. In particular, the terms may be understood in relation to a normal direction to the substrate on which the layer stack is formed, or equivalently in relation to a bottom-up direction of the layer stack. Correspondingly, terms such as "lateral" and "horizontal" are to be understood as locations or directions parallel to the substrate.

As used herein, the terms "first semiconductor material" and "second semiconductor material" refers to different semiconductor materials such that the (bottom and upper) sacrificial layers and the channel layers may be removed and etched selectively to the channel layers.

In some embodiments, the first semiconductor material of the bottom and upper sacrificial layers may be $Si_{1-y}Ge_y$, and the second semiconductor material of the channel layers may be $Si_{1-x}Ge_x$, wherein $0 \leq x < y$. This enables forming of Si-based transistor devices, the different Ge content facilitates a selective processing (e.g. etching) of the sacrificial layers and the channel layers.

In some embodiments, the method may comprise etching through each of the upper sacrificial and channel layers and the bottom sacrificial layer of the device layer stack while using the sacrificial gate structure as an etch mask such that such that portions of the bottom sacrificial, upper sacrificial and channel layers are preserved underneath the sacrificial gate structure, wherein end surfaces of each of the bottom sacrificial, upper sacrificial and channel layers are exposed on opposite sides of the sacrificial gate structure.

The method may further comprise:

subsequent to etching through the device layer stack, forming a mask block covering the end surfaces of the bottom sacrificial layer (e.g. at least partly or completely).

The sacrificial spacer may then be formed while the mask block covers the end surfaces of the bottom sacrificial layer and the method may further comprise:

subsequent to forming the sacrificial spacer, removing the mask block to expose the end surfaces of the bottom sacrificial layer portion and thereafter removing the bottom sacrificial layer.

This facilitates forming of the sacrificial spacer to cover the end surfaces of the upper sacrificial layers and the channel layers such that the end surfaces of the bottom sacrificial layer may be (at least partly) exposed for the subsequent etching to remove the bottom sacrificial layer.

As may be appreciated, the etching through the device layer stack may result in forming of cuts extending through the device layer stack (e.g. top-down) on opposite sides of the sacrificial gate structure. The mask blocks may accordingly be formed at a bottom of the cuts.

Extending the etching through also the bottom sacrificial layer may facilitate the subsequent (complete) removal of the bottom sacrificial layer by reducing an amount of first semiconductor material of the bottom sacrificial layer remaining to be removed after forming the sacrificial spacer. In particular, in case the mask block is formed to completely cover the end surfaces of the bottom sacrificial layer (wherein the sacrificial spacer may be formed to expose the entire end surfaces of the bottom sacrificial layer), a surface area of the bottom sacrificial layer exposed to the subsequent further etching may be maximized.

Forming the sacrificial spacer may comprise conformally depositing a sacrificial spacer material and anisotropically etching (e.g. top-down) the sacrificial spacer material such that the sacrificial spacer material is removed from an upper surface of the mask block and remains to form the sacrificial spacer covering the end surfaces of the upper sacrificial and channel layers.

The sacrificial spacer may hence be "selectively" formed to cover the end surfaces of the upper sacrificial and channel layers.

By the term "conformally depositing" or "conformal deposition" is hereby meant a deposition process resulting in a conformally growing layer or film. Conformal deposition may be achieved using an atomic layer deposition (ALD) process.

Forming the mask block may comprise depositing and then etching back (e.g. top-down) a mask material to a level below the upper sacrificial and channel layers.

The mask material may be etched back to a thickness sufficient to cover (e.g. at least partly or completely) the end surfaces of the bottom sacrificial layer. The mask material may be etched back to a level below a bottom-most one of the upper sacrificial and channel layers. The cover spacer may hence be formed to cover also the bottom-most upper sacrificial and channel layer.

In some embodiments, the method may comprise stopping the etching through the device layer stack while at least a thickness portion of the bottom sacrificial layer remains on either side of the sacrificial gate structure and subsequently forming the sacrificial spacer, wherein the further etching of the device layer stack may remove that at least a thickness portion of the bottom sacrificial layer remaining on either side of the sacrificial gate structure, and an intermediate portion of the bottom sacrificial layer underneath the upper sacrificial and channel layers.

This facilitates forming of the sacrificial spacer to cover the end surfaces of the upper sacrificial layers and the channel layers such that the end surfaces of the subsequently etched bottom sacrificial layer may be (at least partly) exposed for the subsequent etching to remove the bottom sacrificial layer.

Forming the sacrificial spacer may comprise conformally depositing a sacrificial spacer material and anisotropically etching (e.g. top-down) the sacrificial spacer material such that the sacrificial spacer material is removed from an upper surface of the remaining thickness portion of the bottom sacrificial layer, and remains to form the sacrificial spacer covering the end surfaces of the upper sacrificial and channel layers.

The sacrificial spacer may hence be "selectively" formed to cover the end surfaces of the upper sacrificial and channel layers.

In some embodiments, the dielectric bottom material may be etched back such that the dielectric layer comprises a first portion underneath the upper sacrificial and channel layers, and further comprises second and third portions on opposite side of the sacrificial gate structure.

Portions of the bottom dielectric material may hence remain to provide isolation underneath the subsequently formed source and drain regions. The bottom dielectric layer may extend uninterrupted underneath the source/drain regions and the channel layers. That is, the bottom dielectric layer may comprise a first portion between the channel layers and the substrate (e.g. as viewed along a vertical direction), and a second and third portion between the respective source/drain regions and the substrate (e.g. as viewed along the vertical direction).

In some embodiments, forming the inner spacers may comprise:
 conformally depositing at least one spacer material such that the recesses are filled with the at least one spacer material; and
 subsequently, etching the at least one spacer material such that end surfaces of the channel layers are exposed and portions of the at least one spacer material remains in the recesses to define the inner spacers.

The at least one spacer material forming the inner spacers may be referred to as at least one "inner spacer material", to distinguish from the sacrificial spacer material.

A conformal deposition of the (inner) spacer material(s) allows deposition within the recesses, i.e. to fill the recesses. In particular, the spacer material(s) may be deposited with a thickness such that the recesses are pinched-off (i.e. closed) by the spacer material(s).

As used herein, the term "thickness" is to be understood as a dimension of a structure (e.g. a layer or a thickness of a deposited material) as seen along a normal to a surface on which the structure is formed (e.g. on which the layer or material is deposited).

The conformal deposition of the spacer material(s) may be performed subsequent to forming the cavity, wherein the spacer material(s) may further be deposited in the cavity to partially fill the cavity, and wherein the dielectric bottom material subsequently may be deposited to fill a remaining space in the cavity.

The cavity formed by removing the bottom sacrificial layer may hence be filled with a composite bottom dielectric layer, comprising the dielectric bottom material and the spacer material(s). Such a layer may provide an increased etch resistivity towards subsequent etching steps, such etching steps preceding a gate stack formation process.

The etching of the spacer material(s) may be performed subsequent to depositing and etching back the bottom dielectric material. Portions of the inner spacer material covered by the bottom dielectric material after the etch-back may hence be preserved.

In some embodiments, forming the inner spacers may comprise the method may further comprise, conformally depositing a first (inner) spacer material partially filling the recesses and then a second (inner) spacer material filling a remaining spacer in the recesses, and subsequently etching the second spacer material to expose portions of the first spacer material on the end surfaces of the channel layers, and subsequently etching the first spacer material to expose the end surfaces of the channel layers, wherein portions of the first and second spacer material remain in the recesses to define the inner spacers.

The first and second (inner) spacer materials hereby refer to different spacer materials, e.g. different dielectric materials. The first spacer material may during the etching of the second spacer material act as an etch stop material, thus providing further protection for the end surfaces of the channel layers, during the inner spacer formation. That is the second spacer material may be etched selectively to the first spacer material.

In some alternative embodiments, forming of the etch stop layer may be obviated, wherein the inner spacer material accordingly may be deposited on the end surfaces of the channel layers and subsequently be etched to expose the end surfaces of the channel layers.

In some embodiments, the bottom sacrificial layer may be thicker than each upper sacrificial layer. As no inner spacer is needed at the bottom sacrificial layer, a thickness of the bottom sacrificial layer may be chosen without regard to facilitating the inner spacer formation. A thicker bottom sacrificial layer may hence be used to enable forming of a correspondingly thicker bottom dielectric layer.

In some embodiments, the device layer stack may further comprise a dummy channel layer of the second semiconductor material on the bottom sacrificial layer, wherein a bottom-most upper sacrificial layer may be formed on the dummy channel layer and wherein the further etching of the device layer stack to remove the bottom sacrificial layer may comprise selectively etching the first semiconductor material.

The dummy channel layer may hence be used as an etch mask while removing the bottom sacrificial layer, counteracting etching of the upper sacrificial and (active) channel layers from below. By forming the dummy channel layer of the same second semiconductor material as the active channel layers, the device layer stack may still be formed with a comparably simple composition, e.g. two different semiconductor materials, thus facilitating fabrication of the device layer stack and enabling forming of active channel layers of higher material quality.

In some embodiments, the method may further comprise:
forming a gate trench between the gate spacers by removing the sacrificial gate body;
removing the upper sacrificial layers by selectively etching the first semiconductor material from the gate trench; and
forming a gate stack in the gate trench, on the channel layers.

Removing the upper sacrificial layers enables forming the gate stack to be formed along upper and lower surfaces of the channel layers and hence between the channel layers.

In some embodiments, the aforementioned device layer stack may be a first device layer stack, and the method may further comprise:
forming a second device layer stack on the substrate, the second device layer stack having a same composition as the first device layer, and the first and second device layer stacks being separated by a vertically oriented insulating wall, wherein the bottom sacrificial layers, the upper sacrificial layers and the channel layers of the first and second device layer stacks abut opposite side surfaces of the insulating wall,
wherein the method may comprise forming the sacrificial gate structure to extend across the first and second device layer stacks and the insulating wall, and
subsequently applying each of the aforementioned acts (i.e. method and processing steps) to each of the first and second device layer stacks.

A semiconductor device comprising two stacks of channel layers with a respective bottom dielectric layer underneath and separated by an insulating wall may hence be formed. Such a structure is thus suitable for a forksheet device.

Although the method may be used to form forksheet devices, it is contemplated that the method may be used also to form other horizontal channel FET devices (e.g. NW- of NSHFETs) which may benefit from a bottom dielectric layer and inner spacers.

BRIEF DESCRIPTION OF THE DRAWINGS

The above, as well as additional objects, features and benefits, may be better understood through the following illustrative and non-limiting detailed description, with reference to the appended drawings. In the drawings like reference numerals will be used for like elements unless stated otherwise.

FIGS. 1a-1b depict a semiconductor device structure 100 at an initial stage of the method.

FIG. 2 shows a device layer stack 110 etched through in a top-down direction (e.g. the negative Z-direction) while using the sacrificial gate structure 120 as an etch mask.

FIG. 3 shows subsequent to etching through the device layer stack 110, a mask block 130 has been formed, covering the end surfaces of the bottom sacrificial layer 112.

FIG. 4 shows a sacrificial spacer 140 has been formed covering the end surfaces of the layers of the device layer stack part 111 above the mask block 130, in particular the end surfaces of the upper sacrificial and channel layers 114, 116. As shown, the sacrificial spacer 140 may further be formed on the gate spacer 124. The sacrificial spacer 140 may be formed while the mask block 130 covers (partly as shown, or completely) the end surfaces of the bottom sacrificial layer 112. The presence of the mask block 130 may thus prevent formation of the sacrificial spacer 140 along the (parts) of the end surfaces of the bottom sacrificial layer 112 covered by the mask block 130.

FIG. 5 shows that the mask block 130 has been removed subsequent to forming the sacrificial spacer 140. The (parts) of the end surfaces of the bottom sacrificial layer portion 112 covered by the mask block 130 have thus been exposed.

FIG. 6 shows the device structure 100 at a stage after the bottom sacrificial layer 112 (e.g. the bottom sacrificial layer portion 112) has been removed by further etching the device layer stack 110 (i.e. the device layer stack part 111) while using the sacrificial spacer 140 and the sacrificial gate structure 120 as an etch mask. A cavity 142 has thus been formed in the device layer stack 110. Corresponding cavities 142, 142', 142" may as shown be formed in each part of the device layer stack 111, 111', 111".

FIG. 7 shows sacrificial spacer 140 removed to expose the end surfaces of the layers of the device layer stack part 111 previously covered by the sacrificial spacer 140, e.g. the end surfaces of the upper sacrificial and channel layers 114, 116.

FIG. 8 shows recesses 144 formed in the device layer stack 110 (e.g. in each device layer stack part 111, 111', 111") by laterally etching back (e.g. along the X- and negative X-direction) end surfaces of each upper sacrificial layer 116 from opposite sides of the sacrificial gate structure 120.

FIG. 9 shows dielectric layer 150 formed in the cavity 142 by depositing and then etching back a dielectric bottom material 151 to a level below a bottom-most one of the channel layers 116a. The dielectric bottom material 151 may be deposited to fill a remaining space in the cavity 142. The dielectric bottom material 151 may accordingly together with the spacer material 145 (and the spacer material 143 if present) define a composite dielectric layer 150 in the cavity 142.

FIG. 10 shows etching of the (second) spacer material 145 (and the first spacer material 143 if present) has been performed such that the end surfaces of the channel layers 116 are exposed and discrete portions of the (second) spacer material 145 (and the first spacer material 143 if present) remains in each recess 144 to define an inner spacer 146 therein.

FIG. 11 shows source and drain regions 152, 154 formed on the channel layers 116.

FIG. 12 shows gate trench 160 formed by removing the sacrificial gate body 122 between the opposite gate spacers 124.

FIGS. 13a-13b show the resulting semiconductor device structure 100 after a gate stack 162 surrounding the released channel layers 116 has been formed in the gate trench 160.

FIG. 14 shows that the recess/etching through of the device layer stack 110 is stopped on or within the bottom sacrificial layer 112.

FIG. 15 shows further etching of the device layer stack 110 to remove the bottom sacrificial layer 112, e.g. using an isotropic etching process, to form the cavities 142, 142', 142''.

FIGS. 16a-b and 17a-17b each depict respective cross-sectional views of the structure 200 taken along vertical planes B-B' (parallel to the XZ-plane) and A-A' (parallel to the YZ plane).

DETAILED DESCRIPTION OF THE PRESENT DISCLOSURE

A detailed description of a method forming a semiconductor device, in particular a horizontal channel transistor device, such as a NSHFET device, will now be given with reference to FIGS. 1a-1b ff. It should be noted that in the figures, the relative dimensions of the shown elements, in particular the relative thickness of the layers, is merely schematic and may differ from a physical structure in order to facilitate understanding of different aspects of the method. The method will be described in conjunction with figures depicting sacrificial layers and channel layers in the shape of nanosheets (e.g. layers having a width to thickness ratio greater than 1). However, it should be noted that the method has a more general applicability and may be used to form also other types of horizontal channel transistor devices, such as NWFET devices.

Figure 1A:
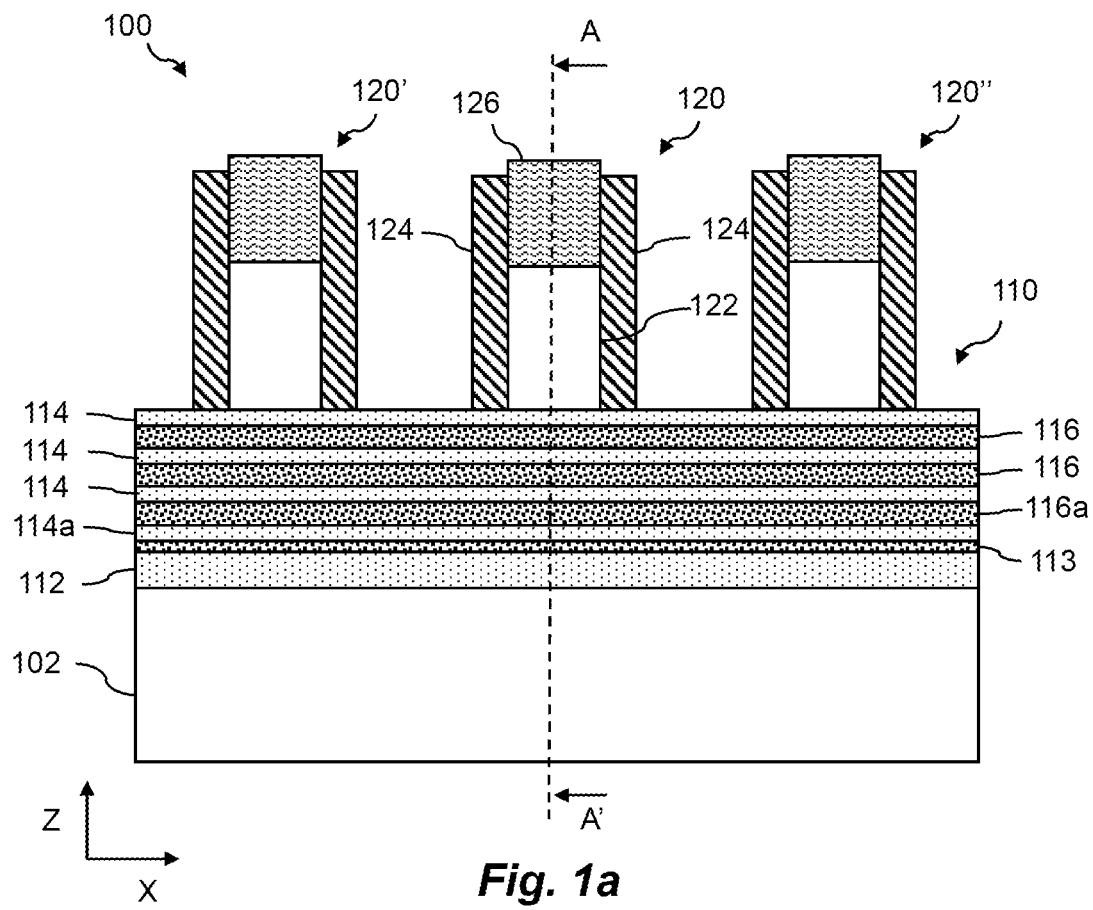
FIGS. 1a-1b, 2-12 and 13a-13b illustrate an embodiment of a method for forming a semiconductor device.
Figure 1B:
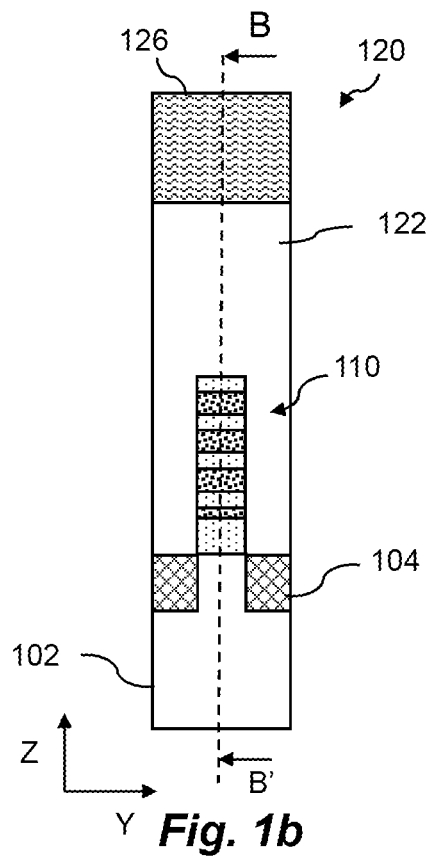

FIGS. 1a-1b depict a semiconductor device structure 100 at an initial stage of the method.

Axes X, Y and Z indicate a first direction, a second direction transverse to the first direction, and a vertical or bottom-up direction, respectively. The X- and Y-direction may in particular be referred to as lateral or horizontal directions in that they are parallel to a main plane of a substrate 102 of the structure 100. The Z-direction is parallel to a normal direction to the substrate 102.

FIGS. 1a-1b depict respective cross-sectional views of the structure 100 taken along vertical planes B-B' (parallel to the XZ-plane) and A-A' (parallel to the YZ plane). The cross-sectional views of the subsequent figures correspond to those in FIGS. 1a-1b unless stated otherwise.

The structure 100 comprises a substrate 102 and a device layer stack 110 formed on the substrate 102. The substrate 102 may be a conventional semiconductor substrate suitable for complementary FETs. The substrate 102 may be a single-layered semiconductor substrate, for instance formed by a bulk substrate such as a Si substrate, a germanium (Ge) substrate or a silicon-germanium (SiGe) substrate. A multi-layered/composite substrate is however also possible, such as an epitaxially grown semiconductor layer on a bulk substrate, or a semiconductor-on-insulator (SOI) substrate, such as a Si-on-insulator substrate, a Ge-on-insulator substrate, or a SiGe-on-insulator substrate.

In FIGS. 1a and 1b, a layer stack 110 has been formed on the substrate 102 in the form of a fin structure, i.e. a fin-shaped layer stack. A longitudinal dimension of the layer stack 110 is oriented along the X-direction. A width dimension of the layer stack 110 is oriented along the Y-direction. A vertical dimension (i.e. height) of the layer stack 110 is oriented along the Z-direction.

The layer stack 110 comprises a bottom sacrificial layer 112 and, over the bottom sacrificial layer 112, an alternating sequence of upper sacrificial layers 114 and channel layers 116. The alternating sequence of upper sacrificial layers 114 and channel layers 116 defines a consecutive sequence of layers. As will be further described below, presence of the bottom sacrificial layer 112 may facilitate forming of a bottom insulating layer underneath the device.

The bottom sacrificial layer 112 and the upper sacrificial layers 114 are each formed of a first semiconductor material. The channel layers 116 are each formed of a second semiconductor material.

For example, the first and second semiconductor materials may be $Si_{1-y}Ge_y$ and $Si_{1-x}Ge_x$ respectively, wherein $0 \leq x < y$. For example, y may be equal to or greater than x+d, where $d \geq 0.25$. In a more specific example, the first semiconductor material may be $SiGe_{0.25}$ and the second semiconductor material may be a Si. These relative differences in Ge-content may facilitate subsequent selective processing (e.g. selective etching) of the sacrificial layers 112, 114 and the channel layers 116. For example, a SiGe layer with a greater concentration of Ge than another Si or SiGe layer may be etched selectively (i.e. at a greater rate) using an HCl-based dry etch may be used. An ammonia peroxide mixture (APM) may also be used. However, other appropriate etching processes (wet or dry) allowing selective etching of higher Ge-content SiGe layers with respect to lower Ge-content SiGe (or Si) layers are per se known in the art and may also be employed for this purpose.

The layers of the device layer stack 110 may each be epitaxial layers, e.g. epitaxially grown using deposition techniques which per se are known, such as chemical vapor deposition (CVD) or physical vapor deposition (PVD). This enables high quality material layers with a beneficial degree of control of composition and dimensions.

The deposited layers may be sequentially formed and subsequently patterned to define the elongated fin-shaped device layer stack 110, extending in the X-direction. While the figures depict only a single fin-shaped device layer stack, it will be understood that a plurality of parallel fin-shaped device layer stacks may be formed. Conventional fin patterning techniques may be used, e.g. single patterning techniques such as lithography and etching ("litho-etch") or multiple-patterning techniques such as (litho-etch)$^x$, self-aligned double or quadruple patterning (SADP or SAQP).

The layers of the layer stack 110 may each be formed as nanosheets, e.g. with a width (along Y) to thickness (along Z) ratio greater than 1, such as a width ranging from 10 nm to 30 nm and a thickness ranging from 3 nm to 10 nm. It is also possible to pattern the device layer stack 110 such that the layers form nanowire-shaped layers. A nanowire may by way of example have a thickness similar to the example nanosheet however with a smaller width, such as 3 nm to 10 nm.

As shown in FIGS. 1a-1b, subsequent to the fin patterning, a lower portion of the device layer stack 110 may be surrounded by a shallow trench isolation (STI) 104, e.g. of $SiO_2$.

The upper sacrificial layers 114 may be of a uniform thickness. Correspondingly, the channel layers 116 may be of a uniform thickness. The upper sacrificial layers 114 may for example have a thickness ranging from 5-15 nm, such as 7 nm. The channel layers 116 may for example have a thickness ranging from 5-15 nm, such as 10 nm. The bottom sacrificial layer 112 may as shown be formed with a thickness exceeding each of the upper sacrificial layers 114. As may be understood from the following, a thicker bottom sacrificial layer 112 enables a thicker bottom dielectric layer. However, it is also possible to form the bottom sacrificial layer 112 with a smaller thickness, such as a same thickness as the upper sacrificial layers 114.

The layer stack 110 may optionally comprise a dummy channel layer 113 of the second semiconductor material. The dummy channel layer 113 may be formed on the bottom sacrificial layer 112 wherein the sequence of upper sacrificial and channel layers 114, 116 may be formed on the dummy channel layer 113. The dummy channel layer 113 may facilitate a subsequent process of removing the bottom sacrificial layer 112 by acting as an etch mask counteracting etching of the upper sacrificial and channel layers 114, 116 from underneath. Dummy channel layer 113 may as shown be formed with a smaller thickness than each one of the channel layers 116. More generally, the dummy channel layer 113 may be formed with a thickness such that the dummy channel layer 113 may provide a sufficient mask budget during the bottom sacrificial layer removal process.

In embodiments comprising the dummy channel layer 113, a bottom-most one 114a of the upper sacrificial layers 114 may, as shown in FIGS. 1a-1b, be formed on the dummy channel layer 113 and a bottom-most one 116a of the channel layers 116 may be formed on the bottom-most upper sacrificial layer 114a. In embodiments not comprising the dummy channel layer 113, a bottom-most one of the channel layers 116 may be formed on the bottom sacrificial layer 112 and a bottom-most one of the upper sacrificial layers may be formed on the bottom-most channel layer. As used herein, the recitation "a first layer on a second layer" in reference to any of the layers of the device layer stack refers to that the first layer is arranged directly on (i.e. in abutment with) the second layer, unless stated otherwise.

As further shown in FIGS. 1a-1b, a sacrificial gate structure 120 has been formed to extend across the device layer stack 110, along the Y-direction. The sacrificial gate structure 120 comprises a sacrificial gate body 122. The sacrificial gate body 122 may be formed by depositing a sacrificial gate body material (e.g. amorphous Si) over the device layer stack 110 and subsequently patterning the sacrificial gate body 122 therein. As depicted in the figures, a number of parallel and uniformly spaced sacrificial gate structures 120, 120', 120" may be formed across the device layer stack 110. Conventional patterning techniques may be used, e.g. single patterning techniques such as lithography and etching ("litho-etch") or multiple-patterning techniques such as (litho-etch) x, SADP or SAQP.

The sacrificial gate structure 120 further comprises a gate spacer or gate spacer layer 124 on opposite sides of the sacrificial gate body 122. The first spacer 124 may also be referred to as gate spacer 124. The gate spacer 124 may be formed by conformally depositing a gate spacer material and subsequently anisotropically etching the gate spacer material (e.g. top-down) to remove portions of the gate spacer material from horizontally oriented surfaces of the structure 100 and such that portions of the gate spacer material remain on the side surfaces of the sacrificial gate body 122 to form the gate spacer 124. The gate spacer 124 may be formed of dielectric material, e.g. as an oxide, a nitride or a carbide such as SiN, SiC, SiCO, SiCN or SiBCN deposited by ALD. The sacrificial gate structure 120 may as shown further comprise a capping layer 156, e.g. formed of one or more layers of hardmask material remaining from the sacrificial gate body patterning. As indicated in the figures, each further sacrificial gate structure such as sacrificial gate structures 120' and 120" may have a same composition as the sacrificial gate structure 120.

Figure 2:
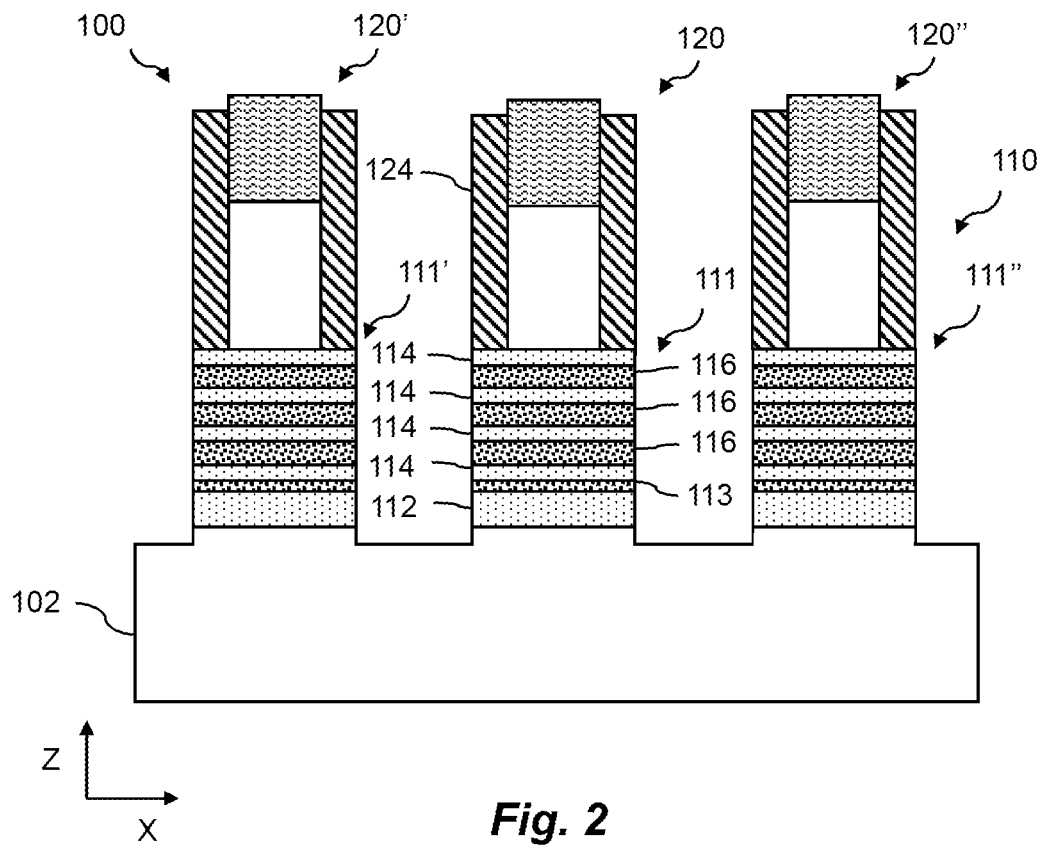

In FIG. 2, the device layer stack 110 has been etched through in a top-down direction (e.g. the negative Z-direction) while using the sacrificial gate structure 120 as an etch mask. The device layer stack 110 has hence been "recessed" on opposite sides of the sacrificial gate structure 120. The etching extends through each of the upper sacrificial layers 114, the active channel layers 116, the dummy channel layer 113 (if present) and through the bottom sacrificial layer 112. The etching may as shown extend into a thickness portion of the substrate 102 but may also be stopped on an upper surface of the substrate 102. Any suitable etching process may be used, e.g. a dry top-down anisotropic etch. Portions of each layer of the device layer stack 110 are preserved underneath the sacrificial gate structure 120, i.e. portions of the upper sacrificial layers 114, the active channel layers 116, the dummy channel layer 113 and the bottom sacrificial layer 112. End surfaces of the respective remaining portions of the upper sacrificial layers 114, the active channel layers 116 and the dummy channel layer 113 (if present), and the bottom sacrificial layer 112 are exposed on opposite sides of the sacrificial gate structure 120.

Reference sign 111 denotes the part of the device layer stack comprising the layer portions preserved underneath the sacrificial gate structure 120. Corresponding device layer stack parts 111' and 111' may as shown be preserved underneath the respective sacrificial gate structures 120' and 120".

For brevity, the term "portions" may in the following be omitted when referring to the portions of the layers preserved underneath a sacrificial gate structure 120 after the recess of the device layer stack 110. Hence, reference to the upper sacrificial layers 114, the active channel layers 116, the dummy channel layer 113 and the bottom sacrificial layer 112 may in the following be understood as a reference to the respective portions of these layers.

Reference will in the following mainly be made to the sacrificial gate structure 120 and the device layer stack 110, however the description is equally applicable to the further sacrificial gate structures 120', 120" and corresponding device layer stack parts 111', 111".

Figure 3:
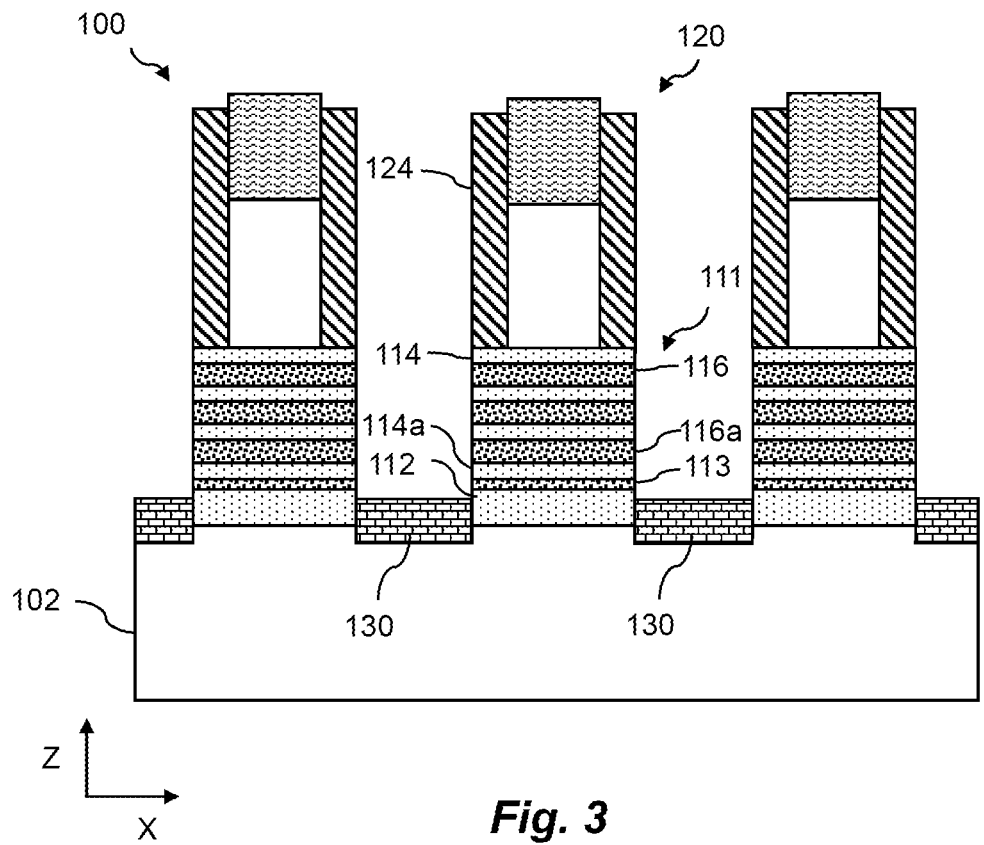

In FIG. 3, subsequent to etching through the device layer stack 110, a mask block 130 has been formed, covering the end surfaces of the bottom sacrificial layer 112. The mask block 130 may be formed by depositing and then etching back a mask material to a level below the upper sacrificial and channel layers 114, 116, thus defining the thickness (e.g. along the Z direction) of the mask block 130. The mask material may be, for instance, spin-on-carbon or another organic spin-on material, or another non-conformally/bottom-up deposited masking material. In FIG. 3, the mask block 130 may be formed with a thickness such that it only partially covers the end surfaces of the bottom sacrificial layer 112, and such that an upper portion of the respective end surfaces of the bottom sacrificial layer 112 is exposed. However, the mask block 130 may in other embodiments be formed to completely cover the end surfaces of the bottom sacrificial layer 112. As may be understood from the following description, in case the mask block 130 is formed to completely cover the end surfaces of the bottom sacrificial layer 112, a surface area of the end surfaces of the bottom sacrificial layer 112 exposed to a subsequent etching to remove the bottom sacrificial layer 112 may be maximized. However, also a partial coverage of the end surfaces of the bottom sacrificial layer 112 (as per the illustrated example) may still provide access for the subsequent etching process for removing the bottom sacrificial layer 112. In any case, the mask material may be etched back to a level below a bottom-most one of the upper sacrificial and channel layers 114a, 116a.

Figure 4:
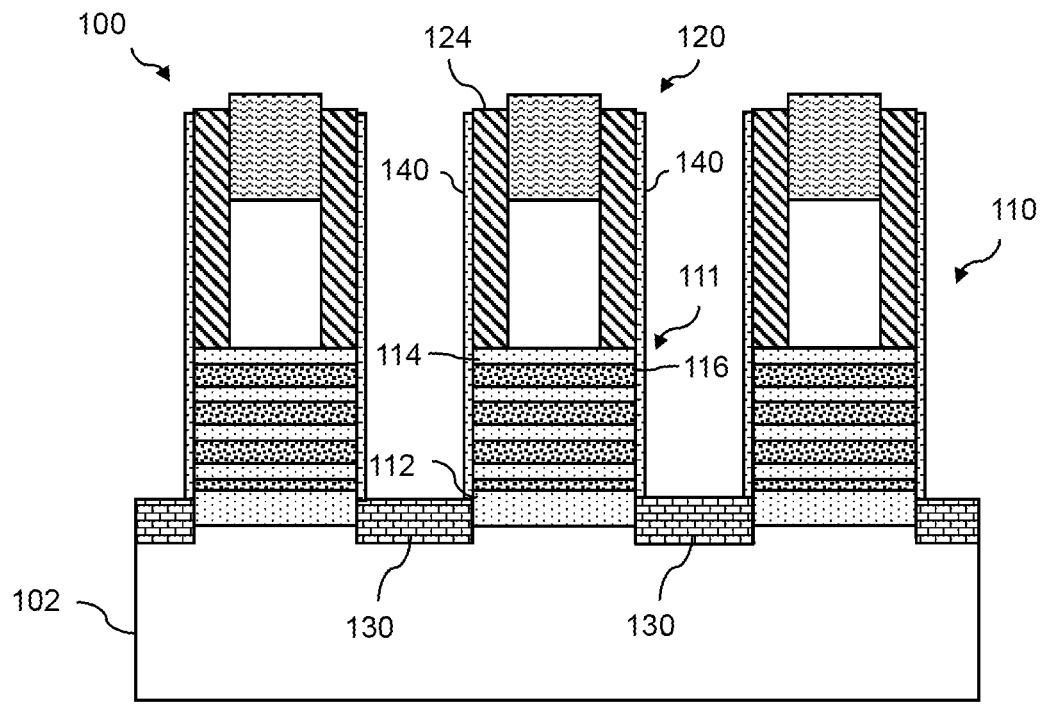

In FIG. 4, a sacrificial spacer 140 has been formed covering the end surfaces of the layers of the device layer stack part 111 above the mask block 130, in particular the end surfaces of the upper sacrificial and channel layers 114, 116. As shown, the sacrificial spacer 140 may further be formed on the gate spacer 124. The sacrificial spacer 140 may be formed while the mask block 130 covers (partly as shown, or completely) the end surfaces of the bottom sacrificial layer 112. The presence of the mask block 130 may thus prevent formation of the sacrificial spacer 140 along the (parts) of the end surfaces of the bottom sacrificial layer 112 covered by the mask block 130. Forming the sacrificial spacer 140 may comprise conformally depositing a sacrificial spacer material (e.g by ALD) and anisotropically etching the sacrificial spacer material top-down (e.g. along the negative Z direction) such that the sacrificial spacer material is removed from an upper surface of the mask block 130) and remains to form the sacrificial spacer 140 on the exposed end surfaces above the mask block 130. The sacrificial spacer 140 may for example be formed by $SiO_2$, deposited using ALD. However, the sacrificial spacer 140 may also be formed of any of the example materials listed in connection with the gate spacer 124. The sacrificial spacer 140 may be formed of a different material than the gate spacer 124 to facilitate a selective etching and removal of the sacrificial spacer 140.

Figure 5:
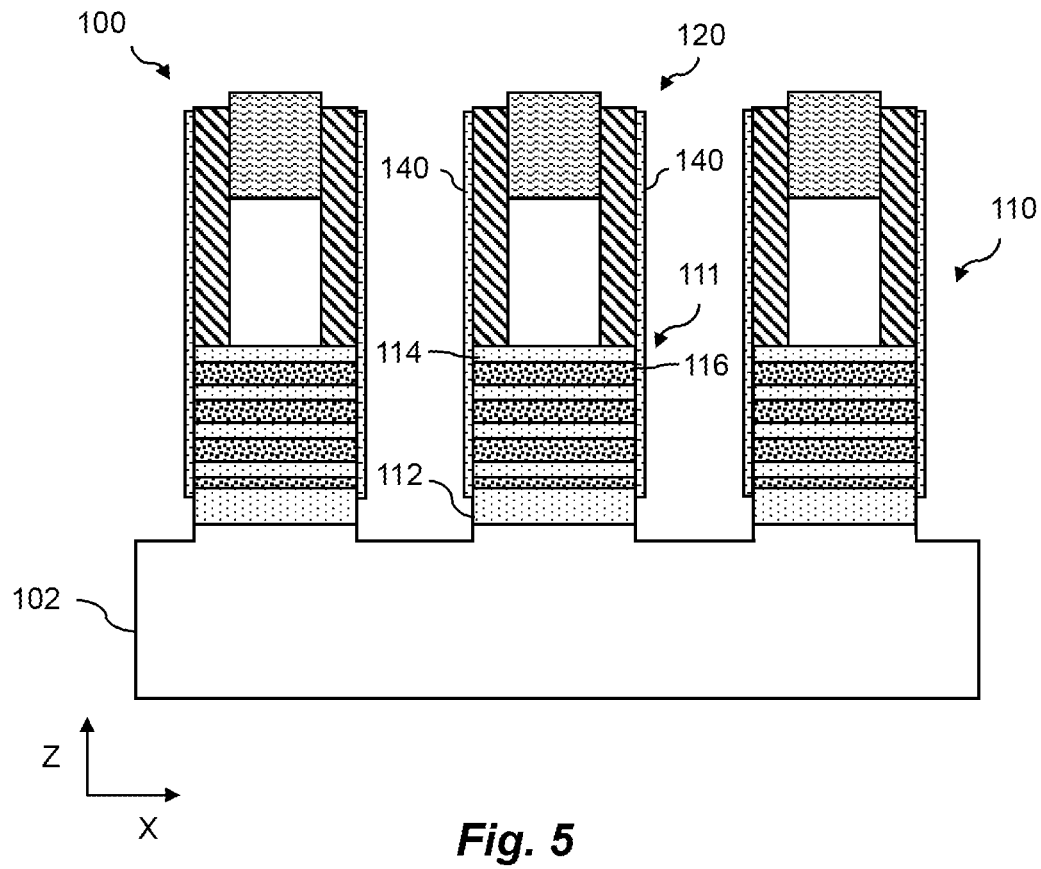

In FIG. 5, the mask block 130 has been removed subsequent to forming the sacrificial spacer 140. The (parts) of the end surfaces of the bottom sacrificial layer portion 112 covered by the mask block 130 have thus been exposed. The mask block 130 may be removed, for instance, by any suitable isotropic (wet or dry) etching process.

Figure 6:
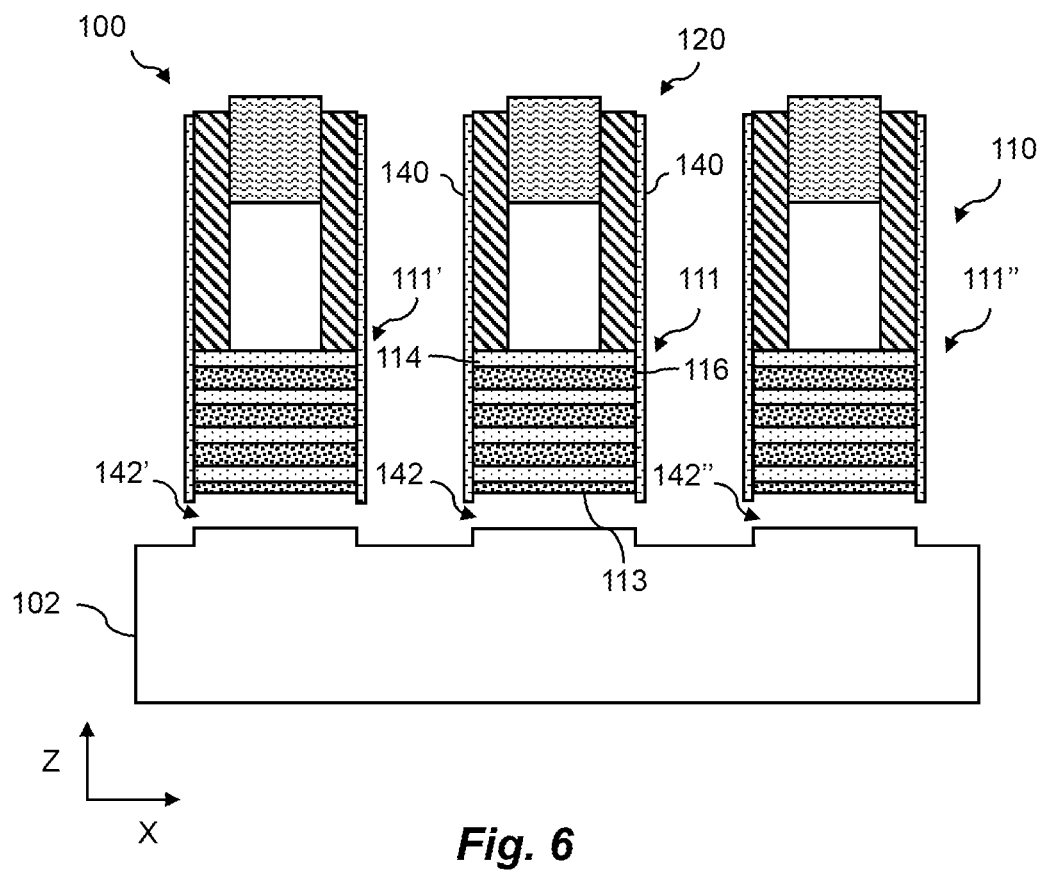

FIG. 6 depicts the device structure 100 at a stage after the bottom sacrificial layer 112 (e.g. the bottom sacrificial layer portion 112) has been removed by further etching the device layer stack 110 (i.e. the device layer stack part 111) while using the sacrificial spacer 140 and the sacrificial gate structure 120 as an etch mask. A cavity 142 has thus been formed in the device layer stack 110. Corresponding cavities 142, 142', 142" may as shown be formed in each part of the device layer stack 111, 111', 111".

The bottom sacrificial layer 112 may be removed by etching the first semiconductor material using an isotropic etching process (wet or dry), to laterally etch back end surfaces of the bottom sacrificial layer 112 from opposite sides of the sacrificial gate structure 120. By employing an etching process selective to the first semiconductor material, the dummy channel layer 113 may act as an etch mask, counteracting etching of the upper sacrificial and (active) channel layers 114, 116 from below. For example, an HCl-based dry etch may be used to remove SiGe material with a greater Ge-content than a Si or SiGe dummy channel material. An ammonia peroxide mixture (APM) may also be used. However, other appropriate etching processes (e.g. wet etching processes) are also known in the art and may also be employed for this purpose.

Figure 7:
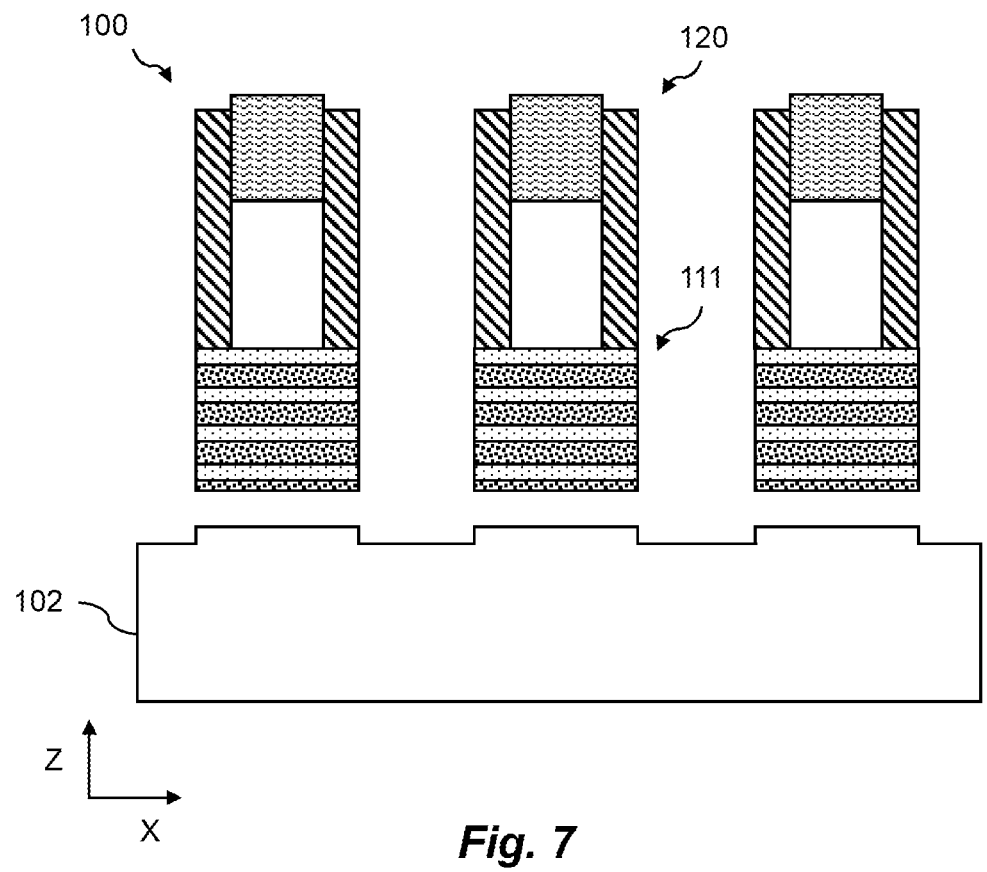

In FIG. 7, the sacrificial spacer 140 has been removed to expose the end surfaces of the layers of the device layer stack part 111 previously covered by the sacrificial spacer 140, e.g. the end surfaces of the upper sacrificial and channel layers 114, 116. The sacrificial spacer 140 may for example be removed using an isotropic etching process (wet or dry), e.g, etching the sacrificial spacer material selectively to the gate spacer material, e.g. a selective $SiO_2$ etch.

Figure 8:
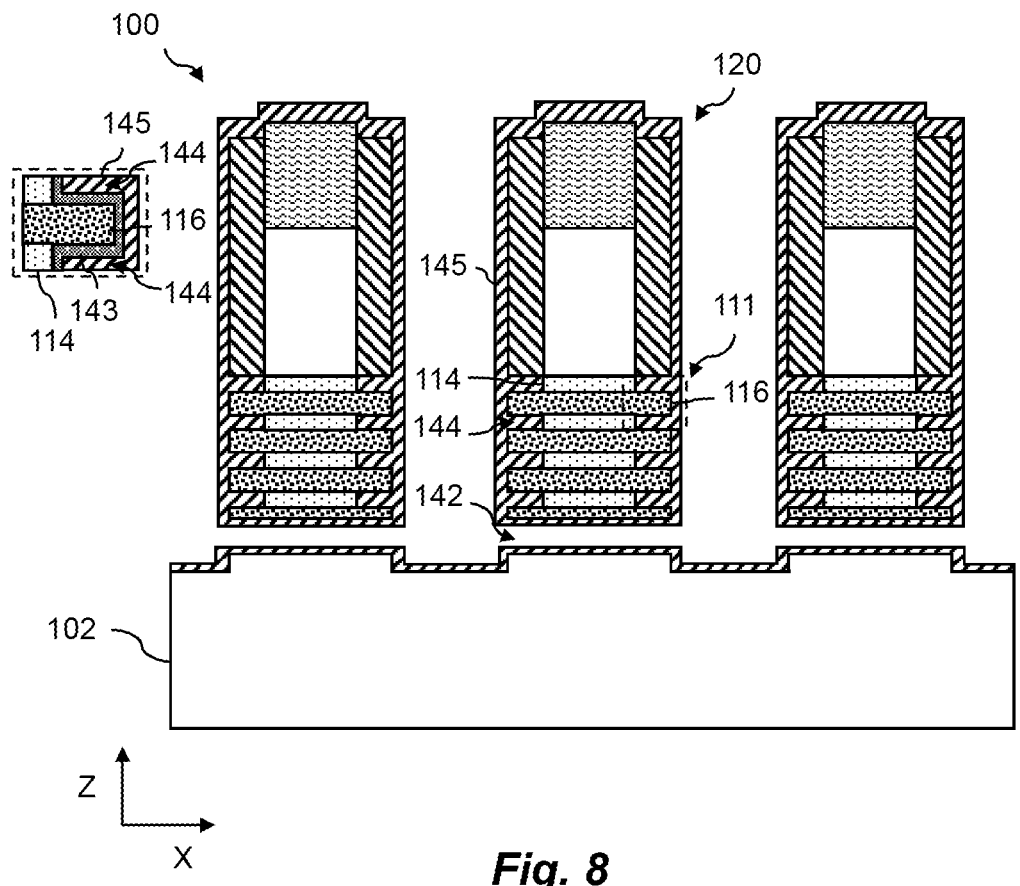

In FIG. 8, recesses 144 have been formed in the device layer stack 110 (e.g. in each device layer stack part 111, 111', 111") by laterally etching back (e.g. along the X- and negative X-direction) end surfaces of each upper sacrificial layer 116 from opposite sides of the sacrificial gate structure 120. The lateral etch back may be achieved by an isotropic etching process. Any suitable dry etching process or wet etching process allowing selective etching of the first semiconductor material may be used (e.g. HCl, or APM). As indicated in FIG. 8, the extent of the lateral etch back may correspond to a thickness of the gate spacer 124. In other words, a depth of the recesses 144 (e.g. along the X-direction) may correspond to the thickness of the gate spacer 124 (along the X-direction.

Subsequent to forming the recesses 144, an inner spacer material 145, has been conformally deposited on the device structure 100 such that the recesses 144 are filled with the spacer material 145. The spacer material 145 may be deposited with a thickness such that the recesses 144 are pinched-off (i.e. closed) by the spacer material 145. Examples of inner spacer materials include conformally deposited dielectric materials, e.g. as an oxide, a nitride or a carbide, for example a same material as the gate spacer 124.

Due to the conformal deposition, the spacer material 145 may further as shown be deposited in the cavity 112, e.g. on interior bounding surfaces of the cavity 112, to partially fill the cavity 112.

As shown in the enlarged inset of FIG. 8, the spacer material 145 may define a second spacer material 145 and the deposition thereof may optionally be preceded by a conformal deposition of a first spacer material 143 covering the end surfaces of the upper sacrificial and channel layers 114, 116 and partially filling the recesses 144. The first spacer material 143 may for example be SiCO and the second spacer material 145 SiN. Assuming the upper sacrificial layers 114 have a thickness in a range from 3 nm to 10 nm, the first spacer material 143 may be deposited with a thickness of e.g. 1-3 nm and the second spacer material 145 may be deposited with a thickness of e.g. 3-5 nm.

Figure 9:
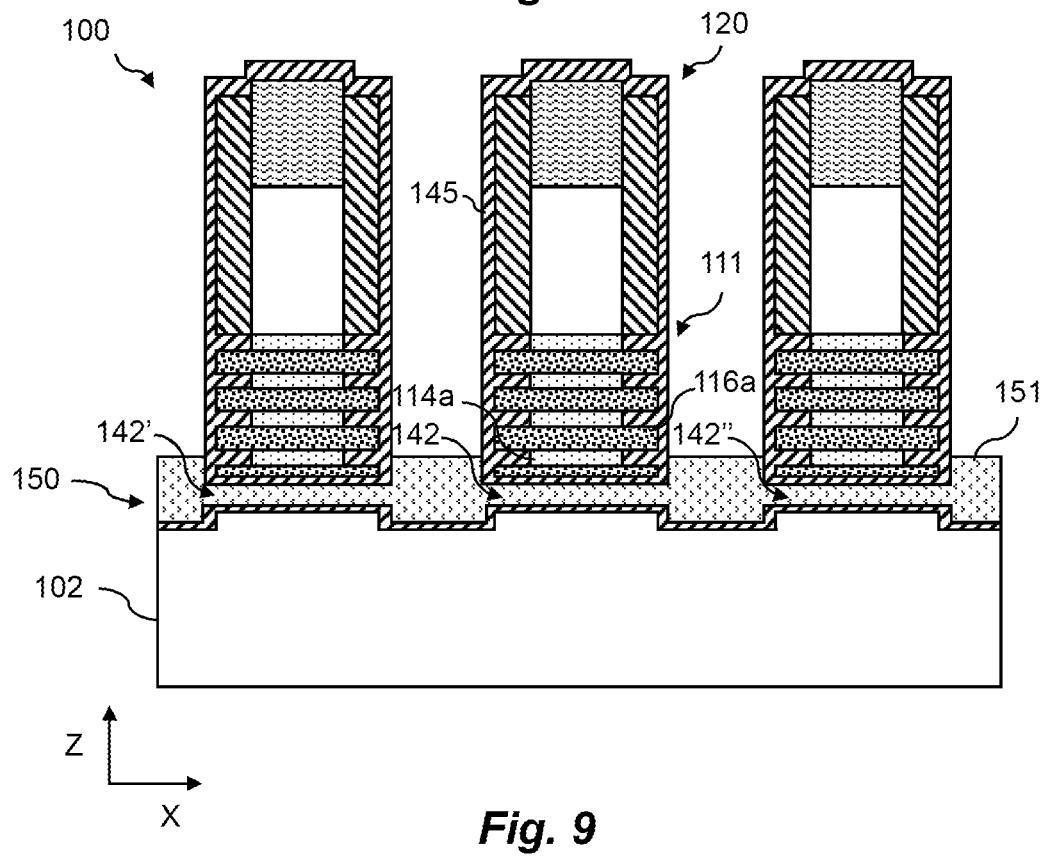

In FIG. 9, a dielectric layer 150 has been formed in the cavity 142 by depositing and then etching back a dielectric bottom material 151 to a level below a bottom-most one of the channel layers 116a. The dielectric bottom material 151 may be deposited to fill a remaining space in the cavity 142. The dielectric bottom material 151 may accordingly together with the spacer material 145 (and the spacer material 143 if present) define a composite dielectric layer 150 in the cavity 142.

As shown in FIG. 9, the dielectric bottom material 151 may be etched back such that dielectric layer 150 comprises a first portion of the material 151 in the cavity 112 underneath the upper sacrificial and channel layers 114, 116, and second and third portions of the material 151 on opposite side of the sacrificial gate structure 120. The second and third thickness portions of the material 151 may thus provide isolation underneath the source and drain regions to be formed. Corresponding portions of dielectric bottom material 151 may remain in the corresponding cavities 142', 142' and the dielectric bottom material 151 (and thus the bottom dielectric layer 150) may hence extend uninterrupted underneath between and through the cavities 142, 142', 142". However, it is also possible to etch back the dielectric bottom material 151 completely, to remove the dielectric bottom material 151 outside the cavity 112 and rely on a subsequently deposited insulating material to fill a remaining space between the substrate 102 and the source and drain regions.

Figure 10:
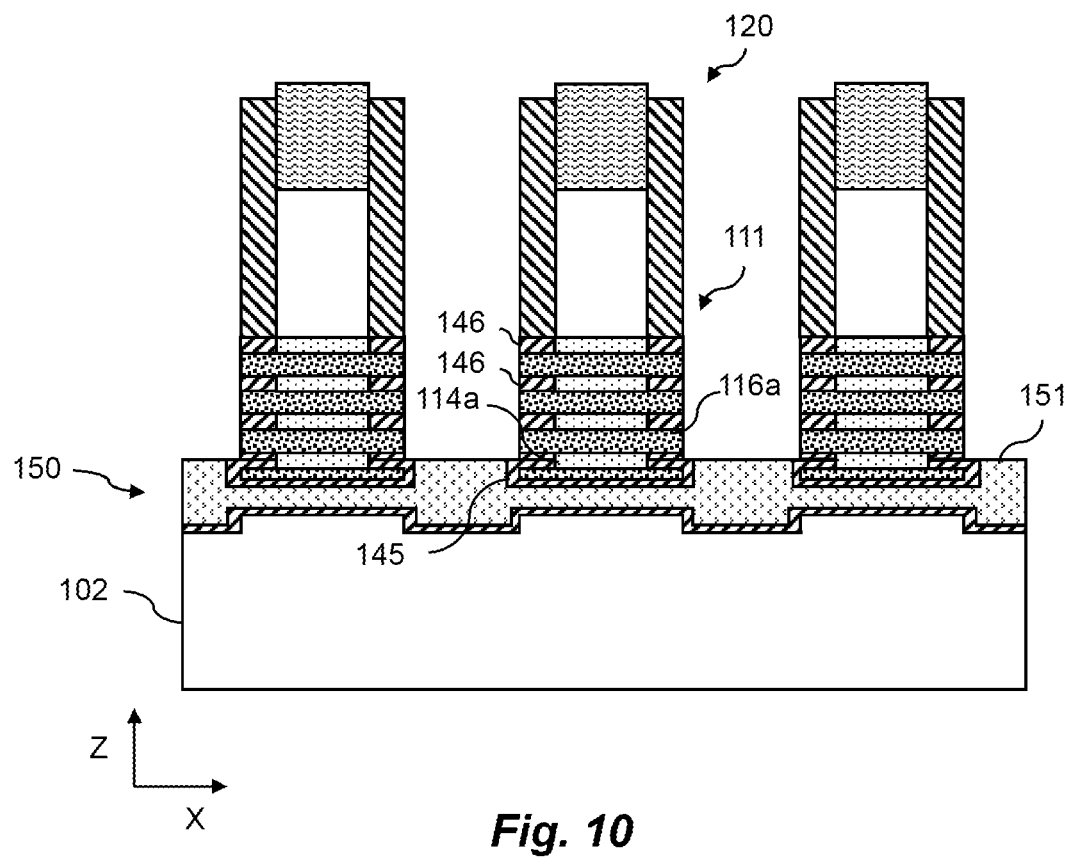

In FIG. 10, etching of the (second) spacer material 145 (and the first spacer material 143 if present) has been performed such that the end surfaces of the channel layers 116 are exposed and discrete portions of the (second) spacer material 145 (and the first spacer material 143 if present) remains in each recess 144 to define an inner spacer 146 therein. In embodiments comprising only the spacer material 145, a single step of isotropic etching of the spacer material 145 may be performed until the end surfaces of the channel layers 116 are exposed. In embodiments comprising both the first and second spacer materials 143, 145, two consecutive steps of isotropic etching may be performed, a first isotropic etch etching the second spacer material 145 and then a second isotropic etch etching the first spacer material 145. The first etch may in particular be selective to the second spacer material 145 such that the first spacer material 143 may act as an etch stop layer for the first etch.

In the illustrated embodiment, the spacer material (e.g. 145 or 143 and 145) may be etched to form the inner spacers 146 subsequent to depositing and etching back the bottom dielectric material 151. The forming of the inner spacers 146 may be hence interleaved with the forming of the bottom dielectric layer 150. However, in other embodiments the spacer material may be etched prior to depositing and etching back the bottom dielectric material 151. As a result, little or no spacer material may remain in the cavity 142, such that the bottom dielectric layer 150 may be formed by only the bottom dielectric material 151.

Figure 11:
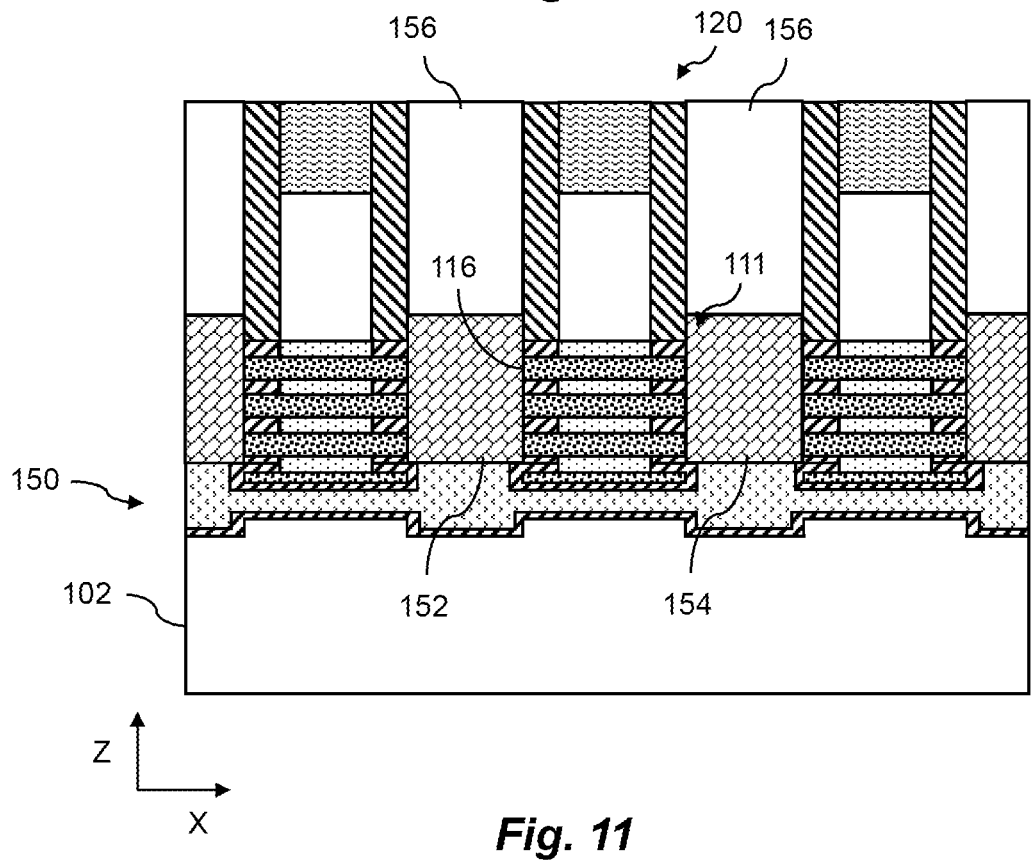

In FIG. 11, source and drain regions 152, 154 have been formed on the channel layers 116. The source and drain regions 152, 154 have been formed by epitaxially growing semiconductor material on end surfaces of the channel layers exposed at opposite sides of the sacrificial gate structure 120. The material may be doped to form source and drain regions 152, 154 with a desired conductivity type. The doping may for example be achieved by in-situ doping.

The source and drain regions 152, 154 may as shown subsequently be covered by an insulating layer 156. The insulating layer 156 may comprise an insulating material, such as an oxide, e.g. $SiO_2$, or another inter-layer dielectric, deposited, planarized and recessed, e.g. by chemical mechanical polishing (CMP) and/or etch back. The CMP and/or etch back may proceed to also remove any capping 126 of the sacrificial gate structure 120. However, as shown, it is also possible to stop the CMP and/or etch back on the capping 126 and subsequently open the capping 126 using a separate etch step. A contact etch stop layer, e.g. of a nitride such as SiN, may further be conformally deposited on the source and drain regions 152, 154 prior to depositing the insulating layer 156.

Figure 12:
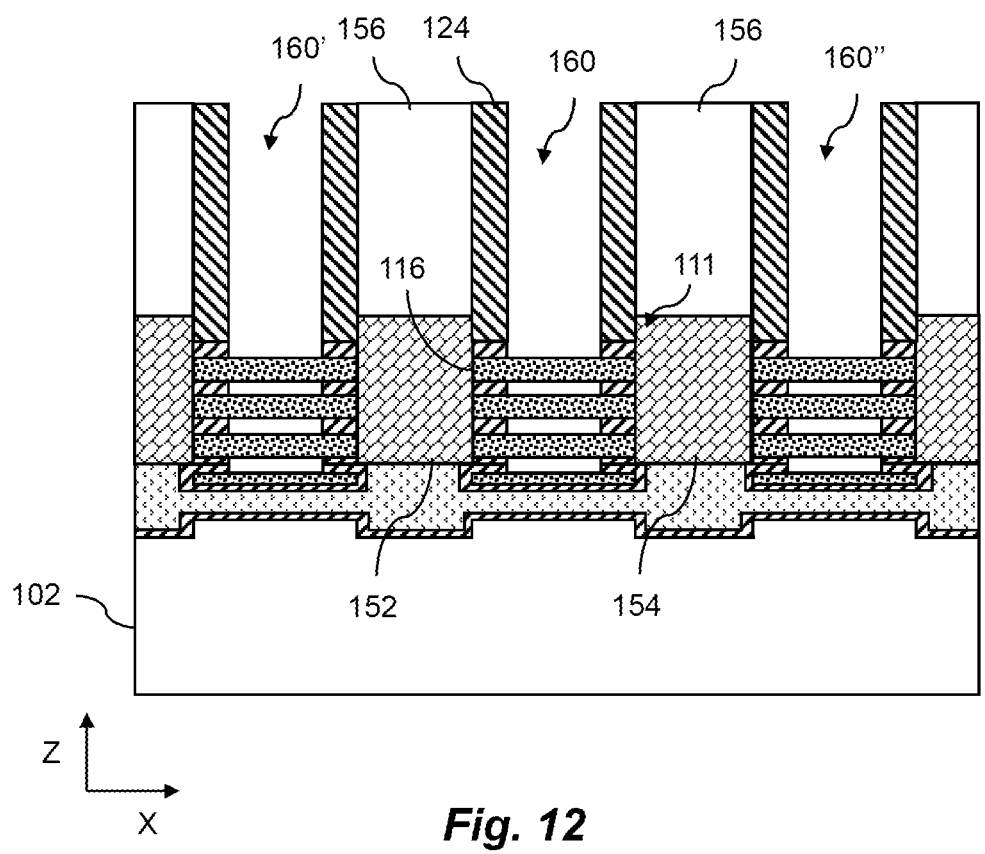

In FIG. 12, a gate trench 160 has been formed by removing the sacrificial gate body 122 between the opposite gate spacers 124. Any conventional suitable etching process (isotropic or anisotropic, wet or dry) allowing selective removal of the sacrificial gate body 122 (e.g. of amorphous Si) may be used.

Subsequently, the upper sacrificial layers 114 have been removed by selectively etching the first semiconductor material from the gate trench 160. A same type of etching process may be used for this step as during the forming of the recesses 160. By removing the upper sacrificial layers 114, the channel layers 116 may be released in the sense that upper and lower surfaces thereof may be exposed within the gate trench 160.

A corresponding gate trench 160', 160" may as shown be formed over the device layer stack parts 111', 111" wherein a corresponding channel layer release may be performed.

Figure 13A:
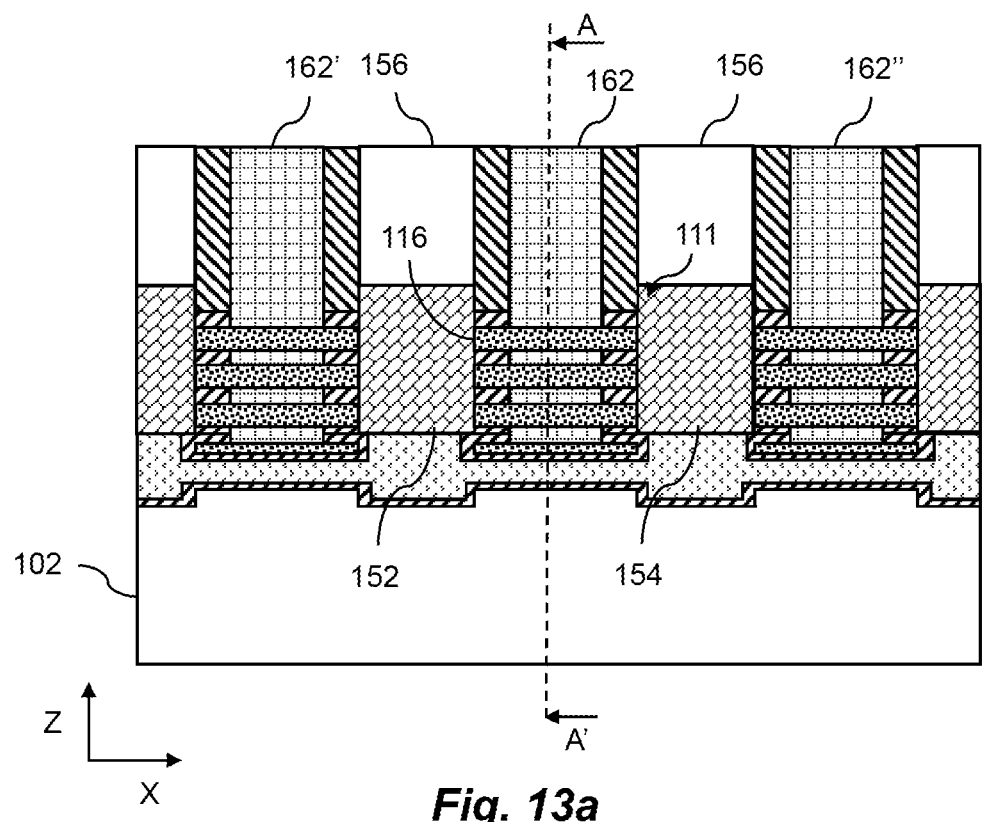
Figure 13B:
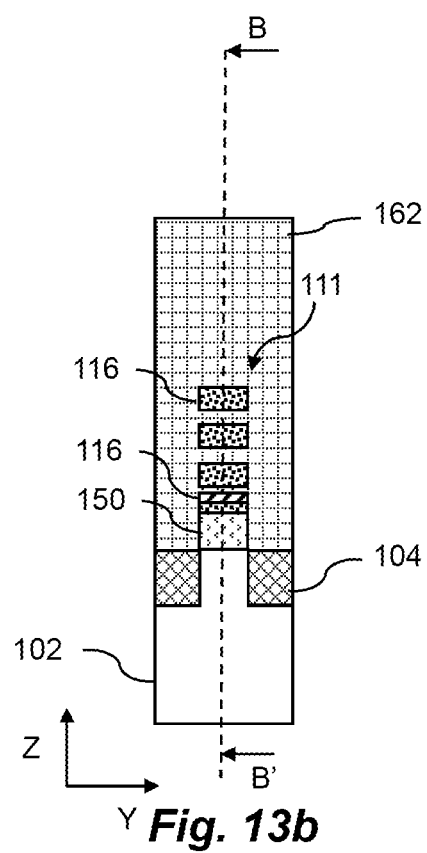

FIGS. 13a-13b depict the resulting semiconductor device structure 100 after a gate stack 162 surrounding the released channel layers 116 has been formed in the gate trench 160. Although shown as single-piece body, the gate stack 162 may comprise multiple layers of different gate materials, e.g. a gate dielectric layer and a work function metal (WFM) layer. The gate dielectric layer may be formed of a conventional high-k dielectric e.g. $HfO_2$, HfSiO, LaO, AlO or ZrO deposited by ALD. The WFM layer may be formed of one or more effective WFMs (e.g. an n-type WFM such as TiAl or TiAlC and/or a p-type WFM such as TiN or TaN) deposited by ALD. The gate stack 162 may further comprise a gate fill metal (such as W, Al, Co or Ru deposited by CVD or PVD) deposited to fill a remaining space of the gate trench 160. As shown in FIG. 13b, the gate stack 162 may hence be formed to completely surround the channel layers 116, and thus define a GAA. Corresponding gate stacks 162', 162" may as shown be formed in the gate trenches 160', 160".

Figure 14:
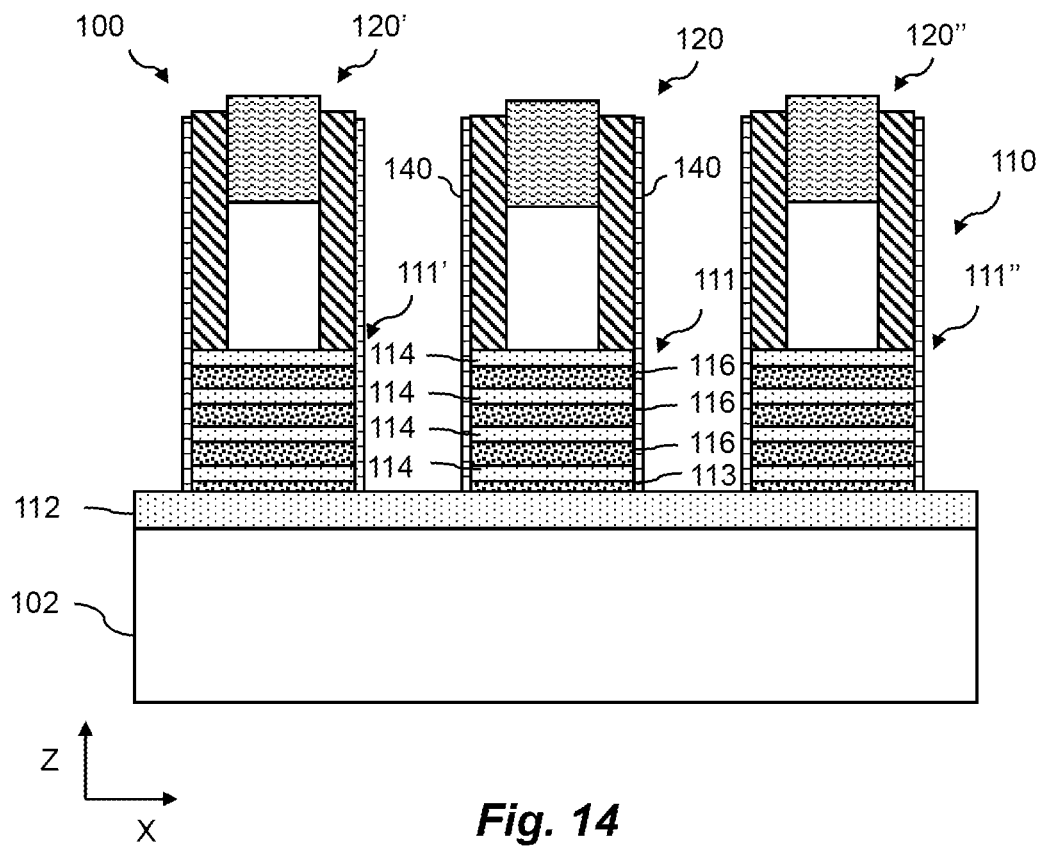
FIGS. 14 to 15 illustrate a further embodiment of a method for method for forming a semiconductor device.
Figure 15:
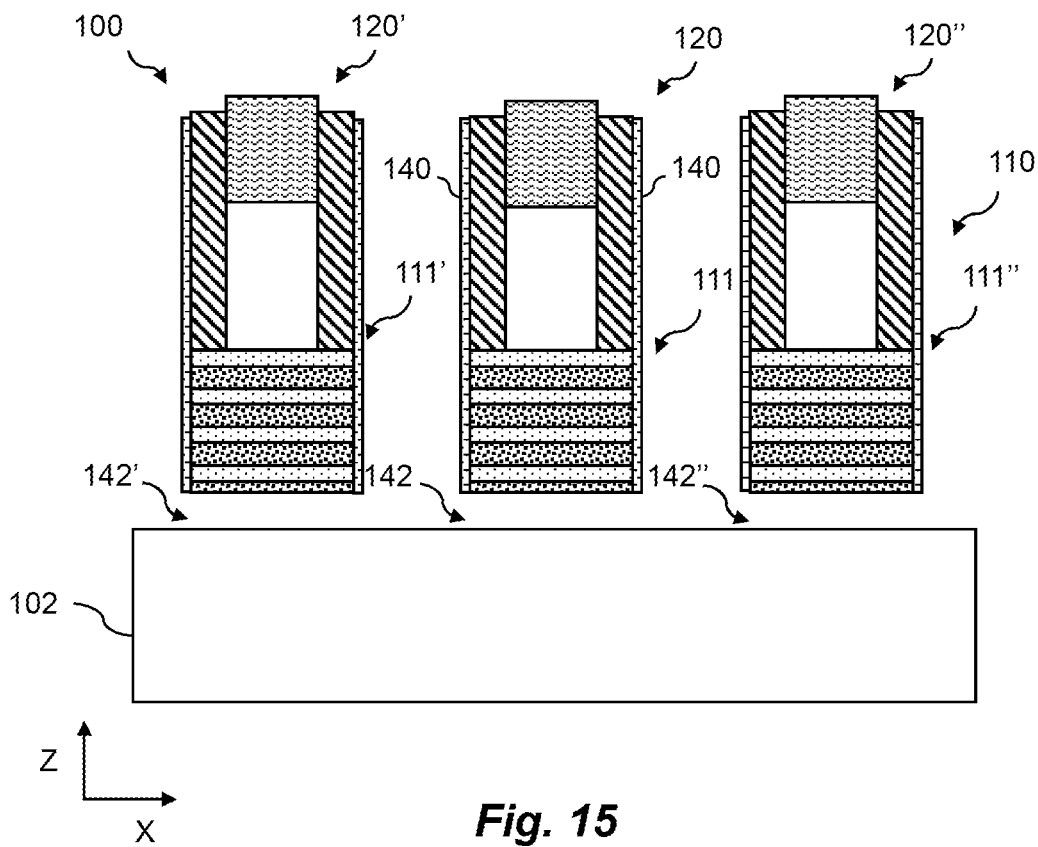
Figure 16A:
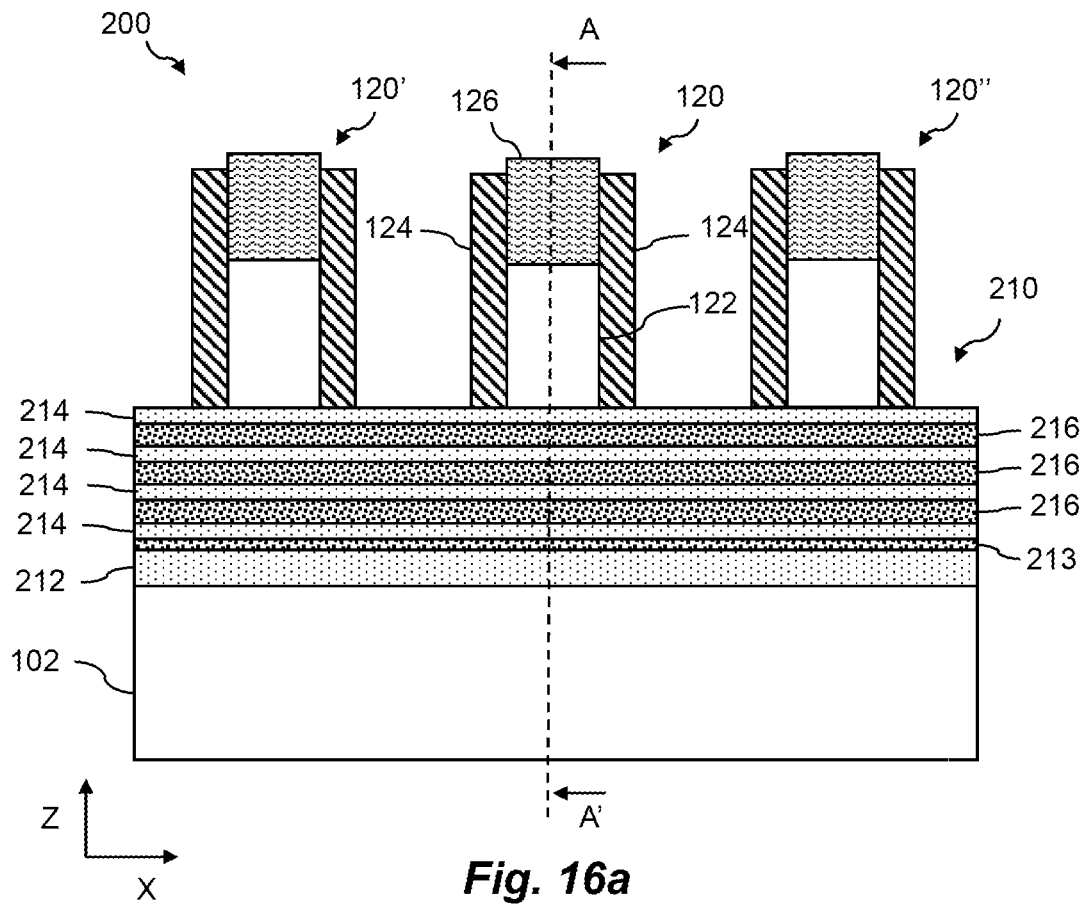
FIGS. 16a-16b to 17a-17b illustrate a further embodiment of a method for method for forming a semiconductor device.
Figure 16B:
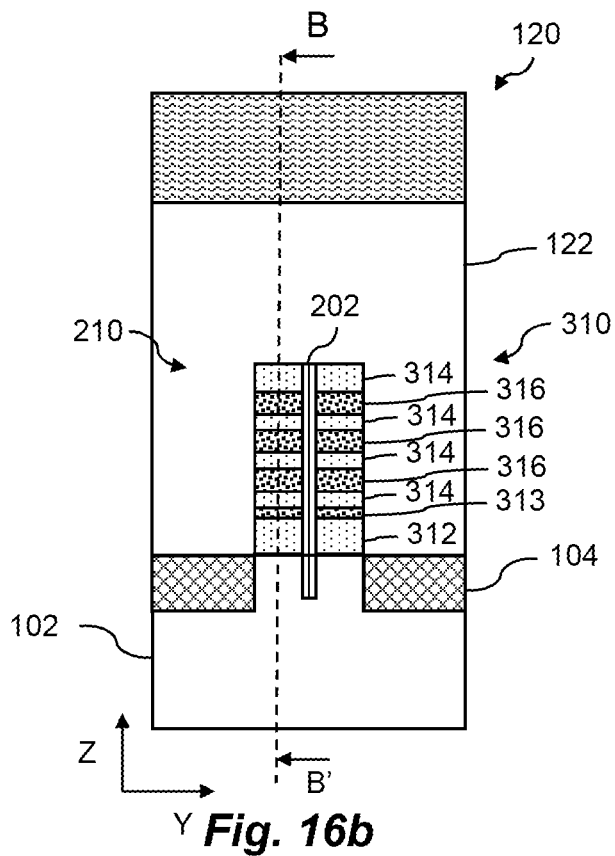

FIGS. 14-15 depict an alternative to the method steps shown in FIGS. 2-6 wherein in FIG. 14 the recess/etching through of the device layer stack 110 is stopped on or within the bottom sacrificial layer 112. The remaining thickness portion of the bottom sacrificial layer 112 may hence provide a function corresponding to that of the mask block 130 in FIGS. 3-4 of preventing forming of the sacrificial spacer 140. The method may thereafter proceed as shown in FIG. 15 by further etching the device layer stack 110 to remove the bottom sacrificial layer 112, e.g. using an isotropic etching process, to form the cavities 142, 142', 142". The method may thereafter proceed as shown and described in connection with FIG. 7 and onwards.

In the above, methods for forming a GAA horizontal channel FET device, such as a GAA NSHFET device, have been described with reference to the figures. An embodiment for forming a FET device of a forksheet type will now be described with reference to FIGS. 16a-16b and 17a-17b. FIGS. 16a-b and 17a-17b each depict respective cross-sectional views of the structure 200 taken along vertical planes B-B' (parallel to the XZ-plane) and A-A' (parallel to the YZ plane).

The method generally proceeds in accordance with the above described method however differs by initially forming a semiconductor device structure 200 on the substrate 102 comprising a first device layer stack 210 and a second device layer stack 310, each of a similar composition as the device layer stack 110 and comprising a respective bottom sacrificial layer 212, 312 (corresponding to layer 112), respective upper sacrificial layers 214, 314 (corresponding to layers 114) and channel layers 216, 316 (corresponding to layers 116). The device layer stacks 210, 310 may further each comprise a dummy channel layer 213, 313 (corresponding to layer 113).

The first and second device layer stacks 210, 310 are separated by a vertically oriented insulating wall 202 such that the bottom sacrificial layers 212, 312, the upper sacrificial layers 214, 314 and the channel layers 216, 316 of the first and second device layer stacks 210, 230 abut opposite side surfaces of the insulating wall 202.

The method may subsequently proceed with forming one or more sacrificial gate structures 120, 120', 120" to extend across each of the first and second device layer stacks 210, 310 and the insulating wall 202.

The method may thereafter proceed by applying each of the method steps described in connection with FIGS. 2-10, to form a bottom dielectric layer 250, 360 in each device layer stack 210, 310 and inner spacers 146. Source and drain regions may subsequently be formed as described with reference to FIG. 11, with the difference that source/drain regions of p-type and source/drain regions of n-type may be formed sequentially on opposite sides of the insulating wall 202 by masking the device layer stack (e.g. 210 or 310) at the opposite side of the insulating wall 202 during the epitaxy. The sacrificial gate structures 120, 120', 120" may subsequently be removed to define gate trenches and the channel layers 216, 316 may be released by removing the sacrificial layers 214, 314. Due to the presence of the insulating wall 202, the channel layers 216, 316 will be only "partly released" in the sense that their upper and lower surfaces as well as outer sidewall surfaces may be laid bare while their inner sidewall surfaces abut the insulating wall 202. The insulating wall 202 may further partition each gate trench (e.g. along the Y-direction) into a first trench section at the first device layer stack 210 and a second trench section at the second device layer stack 310. A respective gate stack 262, 362 may subsequently be deposited in the respective gate trench sections.

For improved device performance, the gate stacks 262, 362 may comprise WFM of opposite conductive type, such as a pWFM 262a in the first gate trench section and an nWFM 362a in the second gate trench section. A remaining space in each gate trench section may be filled with a gate fill material 262b, 362b, which may be, for instance, the same material.

Figure 17A:
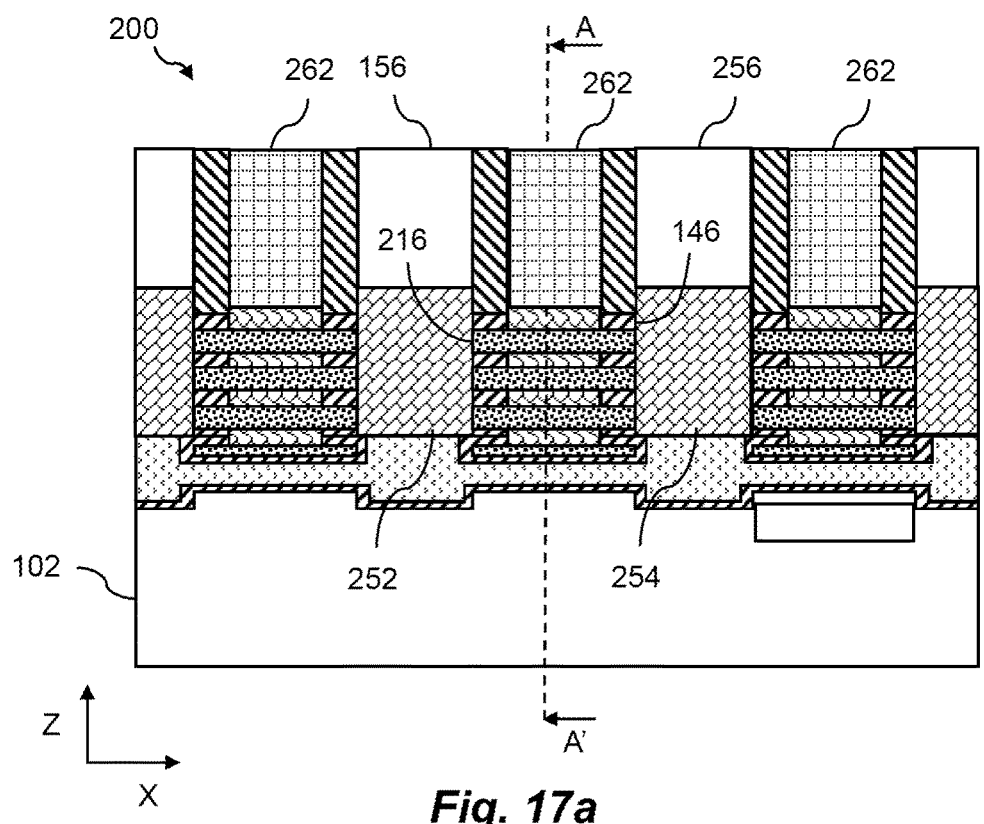
Figure 17B:
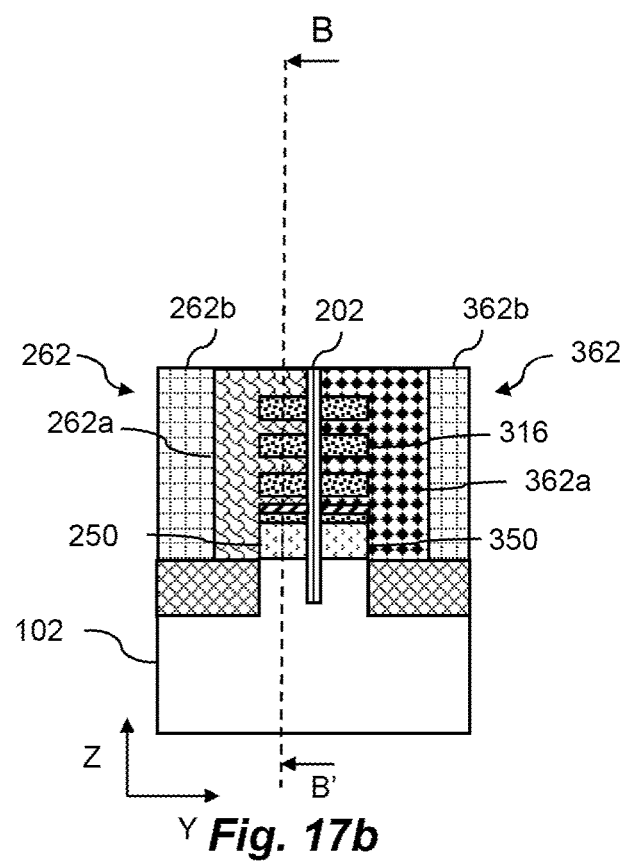

Assuming an nWFM is to be provided in the first gate trench section and a pWM in the second trench section, the formation of the gate stacks 262, 362 may comprise: pWFM deposition in the first and second gate trench sections; selective removal of the pWFM from the first gate trench section; nWFM deposition in the first gate trench section, and optionally also in the second gate trench section on the pWFM; and subsequently gate fill deposition in each of the gate trench sections. The pWFM removal may comprise etching the pWFM in the first trench gate section while masking the pWFM in the second trench gate section. The insulating wall 202 may counteract lateral etching of the pWFM in second gate trench section. The nWFM and pWFM may be deposited in a conformal deposition process, such as ALD. The gate fill material may be deposited, for instance, by CVD or PVD. In this sequence of sub-steps S212a-d, reference to "pWFM" may be substituted by "nWFM" and vice versa. Examples of nWFM include TiAl and TiAlC. Examples of pWFM include TiN and TaN. The gate stacks 262, 363 may subsequently be recessed by CMP and/or metal etch back. By recessing the gate stacks 262, 362 as shown in FIG. 17b to a level of the insulating wall 202, electrically separate gate stacks 262, 362 may be defined. The recessing may however be stopped at a level above the insulating wall 202 such that the gate stacks 262, 362 may be connected across the insulating wall 202.

The present disclosure has mainly been described with reference to a limited number of examples. However, as is readily appreciated by a person skilled in the art, other examples than the ones disclosed above are equally possible within the scope of the present disclosure, as defined by the appended claims.

The invention claimed is:

1. A method for forming a semiconductor device, the method comprising:
    forming a device layer stack on a substrate, the device layer stack comprising a bottom sacrificial layer and over the bottom sacrificial layer an alternating sequence of upper sacrificial layers and channel layers, wherein the bottom sacrificial layer is thicker than each upper sacrificial layer, and wherein the bottom and upper sacrificial layers are formed of a first semiconductor material and the channel layers are formed of a second semiconductor material;
    forming a sacrificial gate structure extending across the device layer stack, the sacrificial gate structure comprising a sacrificial gate body and a gate spacer on opposite sides of the sacrificial gate body;
    etching through each of the upper sacrificial and channel layers and the bottom sacrificial layer of the device layer stack while using the sacrificial gate structure as an etch mask such that portions of the bottom sacrificial, upper sacrificial and channel layers are preserved underneath the sacrificial gate structure, wherein end surfaces of each of the bottom sacrificial, upper sacrificial and channel layers are exposed on opposite sides of the sacrificial gate structure;
    subsequent to etching through the device layer stack, forming a mask block at least partly covering the end surfaces of the bottom sacrificial layer;
    forming a sacrificial spacer covering the end surfaces of the upper sacrificial and channel layers, wherein the sacrificial spacer is formed while the mask block covers the end surfaces of the bottom sacrificial layer;
    subsequent to forming the sacrificial spacer, removing the mask block to expose the end surfaces of the bottom sacrificial layer and thereafter removing the bottom sacrificial layer;
    while the sacrificial spacer masks the end surfaces of the upper sacrificial and channel layers, further etching the device layer stack to remove the bottom sacrificial layer and thereby form a cavity in the device layer stack;
    forming a dielectric layer in the cavity, comprising depositing and then etching back a dielectric bottom material to a level below a bottom-most one of the channel layers;
    removing the sacrificial spacer to expose the end surfaces of the upper sacrificial and channel layers;
    subsequent to removing the sacrificial spacer, forming recesses in the device layer stack by laterally etching back the end surfaces of the upper sacrificial layers from opposite sides of the sacrificial gate structure;
    forming inner spacers in the recesses; and
    subsequent to forming the dielectric layer and the inner spacers, forming source and drain regions by epitaxially growing semiconductor material on the end surfaces of the channel layers.

2. The method according to claim 1, wherein forming the sacrificial spacer comprises conformally depositing a sacrificial spacer material and anisotropically etching the sacrificial spacer material such that the sacrificial spacer material is removed from an upper surface of the mask block and remains to form the sacrificial spacer covering the end surfaces of the upper sacrificial and channel layers.

3. The method according to claim 1, wherein forming the mask block comprises depositing and then etching back a mask material to a level below the upper sacrificial and channel layers.

4. The method according to claim 2, wherein forming the mask block comprises depositing and then etching back a mask material to a level below the upper sacrificial and channel layers.

5. The method according to claim 1, wherein the method comprises stopping the etching through the device layer stack while at least a thickness portion of the bottom sacrificial layer remains on either side of the sacrificial gate structure and subsequently forming the sacrificial spacer, wherein the further etching of the device layer stack removes the at least a thickness portion of the bottom sacrificial layer on either side of the sacrificial gate structure and an intermediate portion of the bottom sacrificial layer underneath the upper sacrificial and channel layers.

6. The method according to claim 5, wherein forming the sacrificial spacer comprises conformally depositing a sacrificial spacer material and anisotropically etching the sacrificial spacer material such that the sacrificial spacer material is removed from an upper surface of the remaining thickness portion of the bottom sacrificial layer and remains to form the sacrificial spacer covering the end surfaces of the upper sacrificial and channel layers.

7. The method according to claim 1, wherein the dielectric bottom material is etched back such that the dielectric layer comprises a first portion underneath the upper sacrificial and channel layers, and second and third portions on opposite sides of the sacrificial gate structure.

8. The method according to claim 1, wherein forming the inner spacers comprises:
   conformally depositing at least one spacer material such that the recesses are filled with the at least one spacer material; and
   subsequently, etching the at least one spacer material such that the end surfaces of the channel layers are exposed and portions of the at least one spacer material remains in the recesses to define the inner spacers.

9. The method according to claim 8, wherein the conformal deposition of the at least one spacer material is performed subsequent to forming the cavity, wherein the at least one spacer material is further deposited in the cavity to partially fill the cavity, and wherein the dielectric bottom material subsequently is deposited to fill a remaining space in the cavity.

10. The method according to claim 9, wherein etching of the at least one spacer material is performed subsequent to depositing and etching back the bottom dielectric material.

11. The method according to claim 8, wherein forming the inner spacers comprises conformally depositing a first spacer material partially filling the recesses and then a second spacer material filling a remaining spacer in the recesses, and etching the second spacer material to expose portions of the first spacer material on the end surfaces of the channel layers, and subsequently etching the first spacer material to expose the end surfaces of the channel layers, wherein portions of the first and second spacer material remain in the recesses to define the inner spacers.

12. The method according to claim 9, wherein forming the inner spacers comprises conformally depositing a first spacer material partially filling the recesses and then a second spacer material filling a remaining spacer in the recesses, and etching the second spacer material to expose portions of the first spacer material on the end surfaces of the channel layers, and subsequently etching the first spacer material to expose the end surfaces of the channel layers, wherein portions of the first and second spacer material remain in the recesses to define the inner spacers.

13. The method according to claim 10, wherein forming the inner spacers comprises conformally depositing a first spacer material partially filling the recesses and then a second spacer material filling a remaining spacer in the recesses, and etching the second spacer material to expose portions of the first spacer material on the end surfaces of the channel layers, and subsequently etching the first spacer material to expose the end surfaces of the channel layers, wherein portions of the first and second spacer material remain in the recesses to define the inner spacers.

14. The method according to claim 1, further comprising:
   forming a gate trench between the gate spacers by removing the sacrificial gate body;
   removing the upper sacrificial layers by selectively etching the first semiconductor material from the gate trench; and
   forming a gate stack in the gate trench, on the channel layers.

15. The method according to claim 1, wherein the device layer stack further comprises a dummy channel layer of the second semiconductor material on the bottom sacrificial layer, wherein a bottom-most upper sacrificial layer is formed on the dummy channel layer and wherein the further etching of the device layer stack to remove the bottom sacrificial layer comprises selectively etching the first semiconductor material.

16. The method according to claim 1, wherein the first semiconductor material is $Si_{1-y}Ge_y$ and the second semiconductor material is $Si_{1-x}Ge_x$, wherein $0 \leq x < y$.

17. The method according to claim 1, wherein the device layer stack is a first device layer stack, and the method further comprises:
   forming a second device layer stack on the substrate, the second device layer stack having a same composition as the first device layer, and the first and second device layer stacks being separated by a vertically oriented insulating wall, wherein the bottom sacrificial layers, the upper sacrificial layer and the channel layers of the first and second device layer stacks abut opposite side surfaces of the insulating wall,
   wherein the method comprises forming the sacrificial gate structure to extend across the first and second device layer stacks and the insulating wall, and
   subsequently processing each of the first and second device layer stacks.

* * * * *